US006714057B2

United States Patent
Nguyen

(10) Patent No.: US 6,714,057 B2
(45) Date of Patent: Mar. 30, 2004

(54) MULTI-PURPOSE DIGITAL FREQUENCY SYNTHESIZER CIRCUIT FOR A PROGRAMMABLE LOGIC DEVICE

(75) Inventor: Andy T. Nguyen, San Jose, CA (US)

(73) Assignee: Xilinx, Inc., San Jose, CA (US)

(*) Notice: Subject to any disclaimer, the term of this patent is extended or adjusted under 35 U.S.C. 154(b) by 0 days.

(21) Appl. No.: 10/306,149

(22) Filed: Nov. 26, 2002

(65) Prior Publication Data

US 2003/0107415 A1 Jun. 12, 2003

Related U.S. Application Data

(63) Continuation-in-part of application No. 10/193,070, filed on Jul. 10, 2002, which is a continuation-in-part of application No. 09/942,230, filed on Aug. 28, 2001, now Pat. No. 6,445,228.

(51) Int. Cl.[7] .............................. G06F 1/04; H03K 5/13
(52) U.S. Cl. ......................... 327/115; 327/117; 377/47
(58) Field of Search ................................. 327/105, 116, 327/115, 117, 113, 121; 377/47

(56) References Cited

U.S. PATENT DOCUMENTS

| | | | |
|---|---|---|---|
| 4,686,386 A | 8/1987 | Tadao | 327/143 |
| 5,675,273 A | 10/1997 | Masleid | 327/181 |
| 5,684,418 A | 11/1997 | Yanagiuchi | 327/99 |
| 5,914,996 A | 6/1999 | Huang | 377/39 |
| 6,057,709 A * | 5/2000 | hesley | 326/54 |
| 6,061,418 A | 5/2000 | Hassoun | 377/47 |
| 6,133,796 A | 10/2000 | Monk | 331/16 |
| 6,239,627 B1 | 5/2001 | Brown et al. | 327/116 |

\* cited by examiner

*Primary Examiner*—Dinh T. Le
(74) *Attorney, Agent, or Firm*—Lois D. Cartier

(57) ABSTRACT

A digital frequency synthesizer (DFS) circuit adds little additional delay on the clock path. True and complement versions of an input clock signal are provided to a first and second passgates, respectively. Under the direction of a control circuit, the passgates pass selected rising edges of the true clock signal, and selected falling edges of the complement clock signal, to an output clock terminal of the DFS circuit. When neither the true nor the complement clock signal is passed, a keeper circuit retains the value already present at the output clock terminal. In some embodiments, both passgates can be disabled and a ground or power high signal can be applied to the output terminal. Other embodiments include PLDs in which the DFS circuits are employed to allow individual clock control for each programmable logic block.

18 Claims, 14 Drawing Sheets

MULTI-PURPOSE DIGITAL FREQUENCY SYNTHESIZER CIRCUIT FOR A PROGRAMMABLE LOGIC DEVICE

FIELD OF THE INVENTION

The invention relates to digital frequency synthesizer (DFS) circuits for clocked digital systems. More particularly, the invention relates to a simple but flexible DFS circuit having particularly advantageous application to a Programmable Logic Device (PLD).

BACKGROUND OF THE INVENTION

Programmable logic devices (PLDs) are a well-known type of digital integrated circuit that can be programmed to perform specified logic functions. One type of PLD, the field programmable gate array (FPGA), typically includes an array of configurable logic blocks (CLBs) surrounded by a ring of programmable input/output blocks (IOBs). The CLBs and IOBs are interconnected by a programmable interconnect structure. Some FPGAs also include additional logic blocks with special purposes (e.g., DLLs, RAM, and so forth).

The CLBS, IOBS, interconnect, and other logic blocks are typically programmed by loading a stream of configuration data (bitstream) into internal configuration memory cells that define how the CLBs, IOBs, and interconnect are configured. The configuration data can be read from memory (e.g., an external PROM) or written into the FPGA by an external device. The collective states of the individual memory cells then determine the function of the FPGA.

Another type of PLD is the Complex Programmable Logic Device, or CPLD. A CPLD includes two or more programmable function blocks connected together and to input/output (I/O) resources by an interconnect switch matrix. Each function block of the CPLD includes a two-level AND/OR structure similar to those used in Programmable Logic Arrays (PLAS) and Programmable Array Logic (PAL) devices. In some CPLDs, configuration data is stored on-chip in non-volatile memory, then downloaded to volatile memory as part of an initial configuration sequence.

For all of these programmable logic devices (PLDs), the functionality of the device is controlled by data bits provided to the device for that purpose. The data bits can be stored in volatile memory (e.g., static RAM cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as ASIC devices (Application Specific Integrated Circuits). PLDs can also be implemented in other ways, e.g., using fuse or antifuse technology.

Whatever type of architecture is used, PLDs generally include many programmable logic blocks of various types interconnected by a programmable interconnect structure. Other circuits included in the PLD might or might not be programmable. These additional circuits can include, for example, configuration logic and a clock distribution structure (clock tree).

FIG. 1 shows a typical PLD and the clock tree included in the PLD. The PLD includes a plurality of programmable logic blocks LB and an array or interconnect matrix (not shown) interconnecting the function blocks. In an FPGA, logic blocks LB correspond, for example, to IOBs or CLBs; in a CPLD, logic blocks LB correspond to function blocks or macrocells.

A PLD pad 101 is designated as the input clock pad, to which the system clock signal is supplied. The system clock signal is buffered (in inverting buffer 102) to reduce the capacitance of the system clock node, then is delivered to an approximate center point CP of the PLD. From center point CP, the clock signal is radially distributed to multiplexers M1–M4 and hence to inverting buffers B1–B4. The radial distribution equalizes the delay from the input clock pad 101 to the destination logic blocks LB.

The system clock signal is routed from center point CP to multiplexers M1–M4, which are individually controlled by configuration memory cells MC1–MC4 to pass either the system clock signal or a power high signal VDD. Each inverting buffer B1–B4 provides a selected signal to one quadrant of the PLD. Thus, if only a portion of the logic blocks are needed to implement a particular design, one or more quadrants can be left deliberately unused when logic is assigned to the logic blocks, and the corresponding multiplexer M1–M4 can be configured such that the corresponding clock buffer B1–B4 supplies the ground signal to the unused quadrant. In CMOS logic, power consumption is largely due to nodes changing state. Thus, grounding the clock signal for an entire quadrant of the device can potentially cut power usage of the PLD as a whole by as much as twenty-five percent.

FIG. 2 shows another prior art PLD, in which a further level of clock control is provided by including for each logic block a programmable clock buffer CB, interposed between inverting buffer B1–B4 and the input clock terminal of the logic block. Programmable clock buffer CB typically has the ability to select either the true or the complement clock signal for the logic block. Lo et al., in U.S. Pat. No. 6,456,126 B1, describe several such clock buffers, as well as several clock buffers having the additional capability of adding a programmable clock doubler function.

The PLDs of FIGS. 1 and 2 include programmable clock trees wherein the power consumption of the PLD can be reduced by disabling the clock signal for one or more quadrants of the device. However, this scheme is only effective if the design implemented in the PLD uses up to three-fourths of the PLD, which can require the purchase of a more expensive PLD than might otherwise be required. Further, all input and output pads for the design must then be mapped to portions of the PLD having an enabled clock signal, which can make board design more difficult. Therefore, it is desirable to provide PLDs having clock trees that offer alternative methods of reducing power consumption. It is further desirable to provide clock buffers offering programmable functions in addition to those described above.

SUMMARY OF THE INVENTION

The invention provides novel clock divider and digital frequency synthesizer (DFS) circuits that add little additional delay on the clock path. Each rising and falling edge of an input clock signal triggers a pulse from a pulse generator circuit. These pulses are passed to a control circuit. True and complement versions of the input clock signal are also provided to a multiplexer circuit. Under the direction of the control circuit, the multiplexer circuit passes selected rising edges of the true clock signal, and selected falling edges of the complement clock signal, to an output clock terminal of the clock divider circuit. When neither the true nor the complement clock signal is passed by the multiplexer, a keeper circuit retains the value already present at the output clock terminal.

According to one embodiment of the invention, every Nth rising edge on the true clock signal is passed to the output terminal, where N is an even integer. Every Nth falling edge on the complement clock signal is also passed to the output terminal. This embodiment provides a divide-by-N output signal. In one embodiment, the selected edges are separated by N/2 rising edges. Thus, this embodiment provides a duty-cycle-corrected output clock signal.

The clock divider circuit of the invention provides the capability to divide by any even integer, rather than being limited to powers of two as are many clock dividers. The delay through the clock divider circuit is the same, regardless of which even number is selected as the divisor.

In one embodiment of the invention, the control circuit is implemented as a counter followed by a decoder circuit. In other embodiments, the control circuit is a state machine having at least four states. In a first state, the state machine enables the "true" path through the multiplexer circuit and disables the "complement" path. In a second state, the state machine disables both paths through the multiplexer, and the next transition is to a third state. In the third state, the state machine enables the "complement" path through the multiplexer circuit and disables the "true" path. In the fourth state, the state machine disables both paths through the multiplexer, and the next transition is to the first state. In the second and fourth states, the keeper circuit maintains the existing value on the output terminal of the clock divider circuit.

An advantage of this circuit is that many of the delays typical of prior art clock dividers (D-flip-flop delays, combinational logic delays, and so forth) are shifted from the clock path to the path through the control circuit. Therefore, these delays are not on the clock path, i.e., not on the critical path for the clock divider circuit.

Another advantage is that by controlling the functionality of the control circuit, any even number (up to the capacity built into the control circuit) can be selected as the divisor for the clock divider circuit. Therefore, the clock divider circuit of the invention provides additional flexibility compared to many known clock dividers.

In one embodiment, the described clock divider circuit is included in a programmable logic device (PLD). In some such embodiments, the control circuit is programmable to select a divisor from a group of supported divisors. The divisor selection can be controlled, for example, using configuration data stored in static RAM (SRAM) cells included in the control circuit.

According to another aspect of the invention, a digital frequency synthesizer (DFS) circuit is provided that includes a pulse generator circuit; a control circuit; first and second passgates controlled by the control circuit and passing a true and complement clock signal, respectively, to an output terminal of the DFS circuit; a keeper circuit coupled to the output terminal of the DFS circuit, and a ground control circuit. The ground control circuit has an input terminal coupled to the output terminal of the DFS circuit and is controlled by a signal on a ground select terminal. Thus, the DFS circuit can provide either a selected clock frequency, by using the control circuit to control the first and second passgates as described above, or a ground signal, by disabling the first and second passgates and enabling the ground select terminal.

In various embodiments, the functions supported by the control circuit can include any or all of the following functions: divide-by-two, divide-by-two with output edges aligned with rising edges of the true clock terminal, divide-by-two with output edges aligned with falling edges of the true clock terminal, multiply-by-two, output same as input, or output inverted from input. In other embodiments, the supported functions include division by an even number other than two.

In some embodiments, the DFS circuit includes a clock delay circuit coupled between the true clock input terminal and the control circuit. Some embodiments include means for selecting either the true or complement clock signal to be passed to the output terminal during power-up.

According to another aspect of the invention, a DFS circuit is provided that includes a true clock input terminal providing an input clock signal having a first frequency; a complement clock input terminal providing an input signal complementary to the input clock signal; an output clock terminal; first and second passgates passing the true and complement clock signals, respectively, to the output clock terminal; a keeper circuit coupled to the output clock terminal; and means for controlling the first and second passgates to provide an output clock signal having a second frequency to the output clock terminal.

In one embodiment, the second frequency is the same as the first frequency. In other embodiments, the second frequency is half or twice the first frequency. In some embodiments, the second frequency is the first frequency divided by an even number other than two. In some embodiments, a divided-down output clock signal can selectively have edges corresponding to either rising or falling edges of the input clock signal.

In some embodiments, the means for controlling the first and second passgates includes means for supplying disable signals to enable terminals of each passgate, and the DFS circuit includes means for providing a ground signal to the output clock terminal when the passgates are disabled. Thus, the output clock signal can be set to ground. In other embodiments, the DFS circuit includes means for providing a power high signal to the output clock terminal when the passgates are disabled.

The invention also provides a PLD in which the clock signal of each logic block can be selectively disabled. This PLD is an improvement over prior art PLDs, in which the clock can only be disabled for an entire quadrant of logic blocks. In a PLD according to this aspect of the invention, power savings can be applied to any design that uses less than all of the logic blocks in the PLD. Additionally, some embodiments provide various options, such as doubling or halving the clock frequency, that can now be selected on a per-logic-block basis. This capability reduces or eliminates the need to route various clock signals throughout the implemented design.

According to this aspect of the invention, a PLD includes a system clock input pad providing a system clock input signal; a clock buffer having an input terminal coupled to the system clock input pad and further having an output terminal; a central node coupled to the output terminal of the clock buffer; a plurality of secondary clock buffers each having an input terminal coupled to the central node and each further having an output terminal; a plurality of programmable logic blocks divided into sets, each set of programmable logic blocks having an associated secondary clock buffer, each programmable logic block having an input clock terminal; and a plurality of synthesizer circuits coupled between the output terminals of the secondary clock buffers and the input clock terminals of associated programmable logic blocks. Each synthesizer circuit includes means for selectively decoupling the input clock terminals of the programmable logic blocks from the output terminals of the secondary clock buffers and providing a steady-state signal to the input clock terminals of the programmable logic blocks.

Some embodiments also support the capability of selectively deriving an output clock signal according to desired characteristics, such as frequency, rising or falling edge alignment, and so forth. Some such embodiments include means for selectively deriving an output clock signal from an input clock signal on the output terminal of the associated secondary clock buffer and providing the output clock signal to the input clock terminal of the associated programmable logic block.

DETAILED DESCRIPTION OF THE DRAWINGS

In the following description, numerous specific details are set forth to provide a more thorough understanding of the present invention. However, it will be apparent to one skilled in the art that the present invention can be practiced without these specific details.

Figure 3:
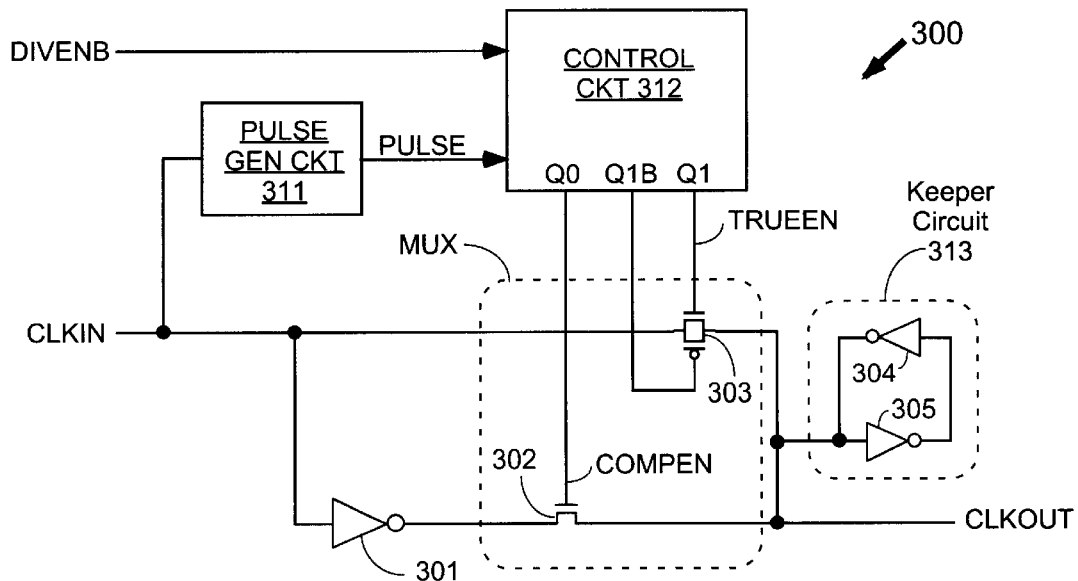
FIG. 3 is a block diagram of a clock divider circuit according to a first embodiment of the invention.

FIG. 3 shows a clock divider circuit 300 according to a first embodiment of the invention. Clock divider circuit 300 includes a pulse generator circuit 311, a control circuit 312, a multiplexer circuit MUX, an inverter 301, and a keeper circuit 313.

In the pictured embodiment, multiplexer circuit MUX includes two passgates 302 and 303 controlled by control circuit 312. In the pictured embodiment, passgate 303 is implemented as a CMOS passgate, because passgate 303 passes rising edges and a voltage drop on the rising edge can adversely impact the performance of the circuit. For example, a high value passed through only an N-channel transistor is dropped by one threshold voltage, therefore it might not be high enough to trip keeper circuit 313. However, passgate 302 is implemented as an N-channel transistor. Because only falling edges are passed through passgate 302, no loss of performance results. In other embodiments, other types of passgates are used for each of passgates 302 and 303. Other types of multiplexer circuits can also be substituted for multiplexer circuit MUX.

Keeper circuit 313 is coupled to output terminal CLKOUT. Keeper circuit 313 provides a weak output signal that reinforces the signal on output terminal CLKOUT. Therefore, the voltage level of the CLKOUT signal remains stored on the output terminal when neither of passgates 302 and 303 is providing a signal. One embodiment of keeper circuit 313 includes cross-coupled inverters 304, 305. However, keeper circuits are well known in the art, and any keeper circuit can be used in clock divider circuit 300, as long as it is weak enough to be overridden by each of passgates 302 and 303.

Figure 3A:
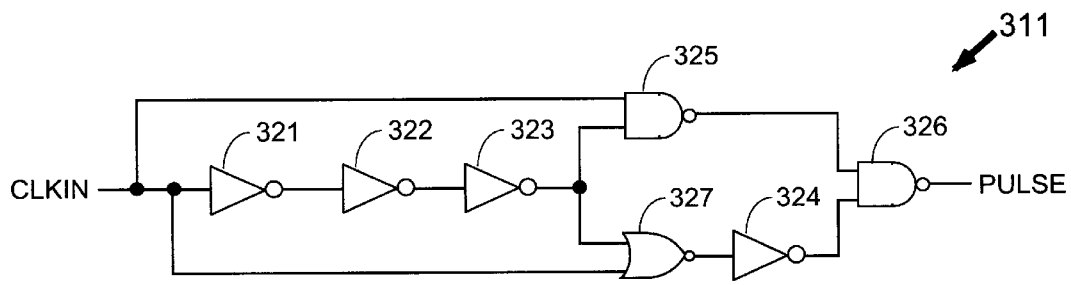
FIG. 3A shows one embodiment of a pulse generator circuit that can be used with the embodiment of FIG. 3.

Pulse generator circuit 311 provides an output pulse in response to each rising and falling edge of clock input signal CLKIN. (See, for example, the waveforms for signals CLKIN and PULSE provided in FIG. 3C.) Pulse generator circuit 311 can be implemented, for example, as shown in FIG. 3A. The embodiment shown in FIG. 3A includes inverters 321–324, NOR gate 327, and NAND gates 325–326.

Inverters 321–323 are coupled in series. The first inverter 321 in the series is driven by clock input signal CLKIN, and the final inverter 323 in the series drives both NAND gate 325 and NOR gate 327. Each of NAND gate 325 and NOR gate 327 is also driven by clock input signal CLKIN. NAND gate 326 is driven by NAND gate 325 and also by NOR gate 327 inverted by inverter 324. The output of NAND gate 326 is the PULSE signal, which is provided to control circuit 312 in FIG. 3.

Control circuit 312 controls passgates 302 and 303 to selectively pass rising edges on input clock signal CLKIN, and falling edges on the corresponding complementary signal. For example, to generate a divide-by-two clock signal, control circuit 312 enables passgate 303 to pass every other rising edge of input clock signal CLKIN, and enables passgate 302 to pass every other falling edge of the complementary clock signal provided by inverter 301.

Control circuit 312 can be implemented using a counter and a decoder circuit that decodes the counter values to enable and disable passgates 302 and 303. Those of skill in the art of logic design could easily generate such an implementation. However, FIG. 3B illustrates a preferred approach in which control circuit 312 is implemented as a state machine.

Figure 3B:
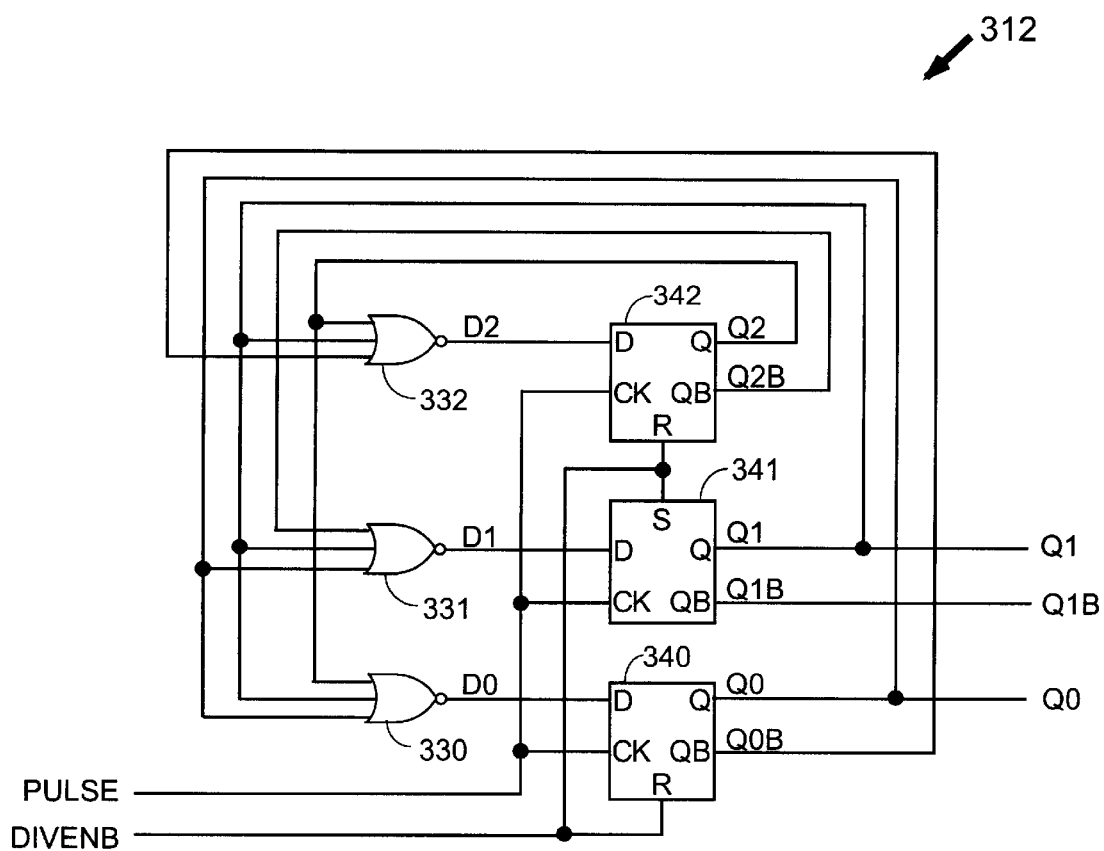
FIG. 3B shows one embodiment of a control circuit that can be used with the embodiment of FIG. 3 to implement a divide-by-two clock divider circuit.

The embodiment of control circuit 312 shown in FIG. 3B includes three flip-flops 340–342 providing signals Q0–Q2, respectively. Signals Q0 and Q2 are initialized to low values, and signal Q1 is initialized to a high value, when enable signal DIVENB is high. NOR gates 330–332 provide the next state values D0–D2, respectively, for flip-flops 340–342. NOR gate 330 implements the function D0=(Q2+Q1+Q0)'. NOR gate 331 implements the function D1=(Q2B+Q1+Q0)'. NOR gate 332 implements the function D2=(Q2+Q1+Q0B)'.

The sequence of states followed by control circuit 312 is shown in Table 1. The symbol "x" indicates a don't-care value.

TABLE 1

| DIVENB | Q2 | Q1 | Q0 | D2 | D1 | D0 | Selected Clock |
|---|---|---|---|---|---|---|---|
| 1 | 0 | 1 | 0 | x | x | x | True |
| 0 | 0 | 1 | 0 | 0 | 0 | 0 | True |
| 0 | 0 | 0 | 0 | 0 | 0 | 1 | Off |
| 0 | 0 | 0 | 1 | 1 | 0 | 0 | Complement |
| 0 | 1 | 0 | 0 | 0 | 1 | 0 | Off |

Note that three flip-flops are used to provide only four states. While two flip-flops can provide four states, one of these states is a "1,1" state (i.e., Q0 and Q1 would both be "1" in one of the four states). If a "1,1" state were used in the clock divider circuit of FIG. 3, a decoder would be required to convert the "1,1" state to a state where neither of passgates 302, 303 was enabled. Therefore, a third flip-flop is preferably used to distinguish between the two OFF states, i.e., between the state of "0,0 going to 0,1" and the state of "0,0 going to 1,0".

Figure 3C:
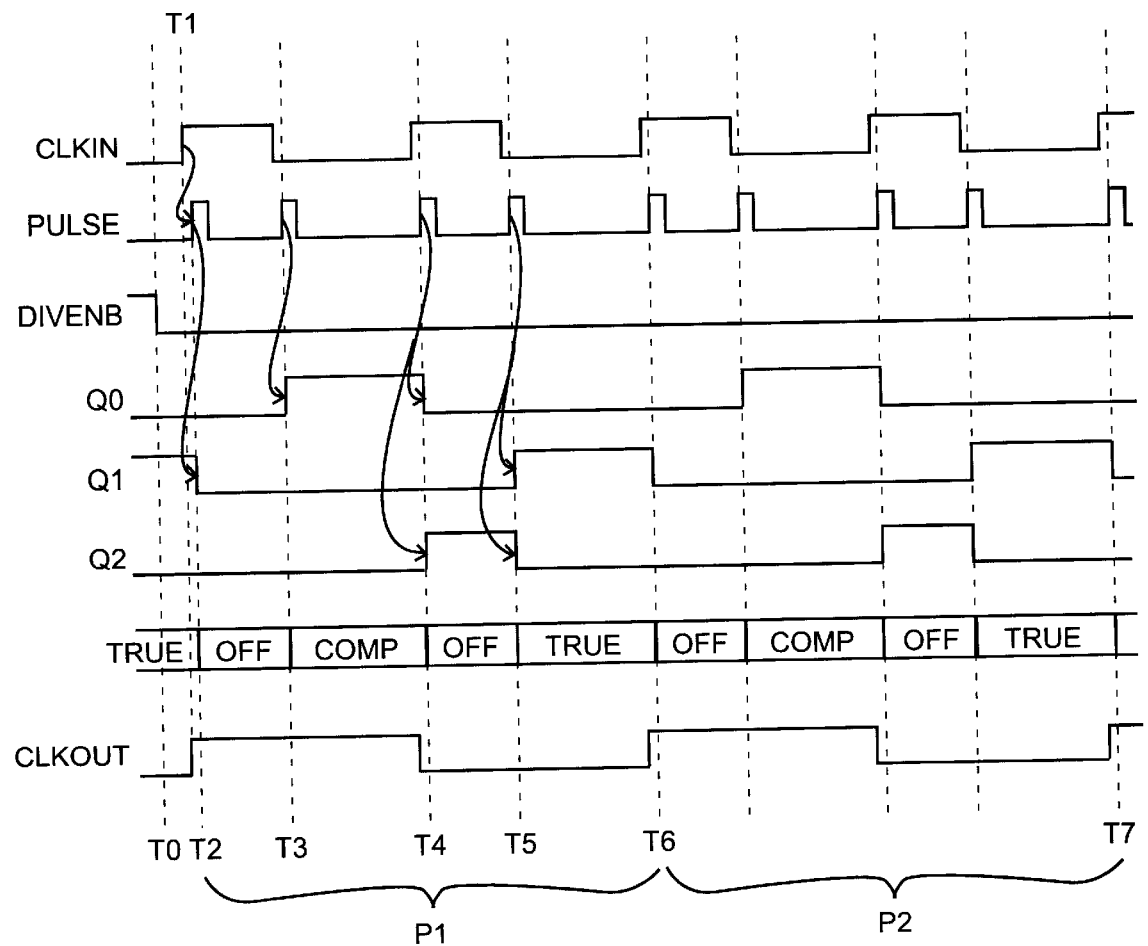
FIG. 3C is a timing diagram for the clock divider circuit of FIG. 3 when the control circuit of FIG. 3B is used.

FIG. 3C shows how the sequence of states shown in Table 1 results in a divide-by-two function for clock divider circuit 300 of FIG. 3. Referring back to FIG. 3, it can be seen that passgate 303 is enabled whenever signal Q1 is high, and passgate 302 is enabled whenever signal Q0 is high. The true input clock signal CLKIN is applied to passgate 303, and a complement clock signal (inverted by inverter 301) is applied to passgate 302. Thus, signal Q1 is also referred to as the "true enable" signal TRUEEN, and signal Q0 is also referred to as the "complement enable" signal COMPEN. Control circuit 312 as shown in FIG. 3B enables passgate 303 whenever a rising edge on signal CLKIN is to be passed, and enables passgate 302 whenever a falling edge on the complement of signal CLKIN is to be passed.

As shown in Table 1, control circuit 312 has four different states when enabled. In a first state, signal Q1 is high and signal Q0 is low. In a second state, signals Q1 and Q0 are both low and the next state will be the third state. In the third state, signal Q0 is high and signal Q1 is low. In a fourth state, signals Q1 and Q0 are both low and the next state will be the first state.

However, while control circuit 312 has four states, clock divider circuit 300 operates in one of three modes: the "TRUE" mode, corresponding to the first state of the control circuit (signal TRUEEN is high, passgate 303 is enabled, and the true clock signal is passed); the "COMP" mode, corresponding to the third state of the control circuit (signal COMPEN is high, passgate 302 is enabled, and the complement clock signal is passed); or the "OFF" mode, corresponding to the second and fourth states of the control circuit (signals TRUEEN and COMPEN are both low, neither of the two passgates is enabled, and keeper circuit 313 maintains the value of the CLKOUT signal).

As shown in FIG. 3C, prior to time T0 enable signal DIVENB is high, holding signals Q0 and Q2 low and signal Q1 high. The clock divider circuit is in TRUE mode, and signal CLKIN is passed to the CLKOUT terminal unchanged except for the delay caused by passgate 303. At time T0, signal DIVENB goes low and the clock divider circuit is enabled. At the next rising edge of input clock signal CLKIN (time T1), the rising edge is passed through passgate 303 and appears at the CLKOUT terminal.

Also in response to the rising edge of input clock signal CLKIN (time T1), a pulse is generated on signal PULSE (time T2), causing flip-flop 341 in control circuit 312 to change state, i.e., signal Q1 goes low. When signal Q1 (which is also signal TRUEEN) goes low, passgate 303 is disabled and the clock divider circuit enters the "OFF" mode.

The next falling edge of signal CLKIN does not result in a falling edge at the CLKOUT terminal, because the circuit is in the OFF mode. However, the resulting pulse on signal PULSE (time T3) causes flip-flop 340 to change state, i.e., signal Q0 goes high. When signal Q0 (which is also signal COMPEN) goes high, passgate 302 is enabled and the clock divider circuit enters the "COMP" mode.

At the next rising edge of input clock signal CLKIN, the complementary falling edge is passed through passgate 302 and appears at the CLKOUT terminal. The rising clock edge also generates a pulse on signal PULSE (time T4), which causes signal Q0 to go low and signal Q2 to go high. When signal Q0 (which is also signal COMPEN) goes low, passgate 302 is disabled and the clock divider circuit enters the "OFF" mode.

The next falling edge of signal CLKIN does not result in a falling edge at the CLKOUT terminal, because the circuit is in the OFF mode. However, the resulting pulse on signal PULSE (time T5) causes signal Q1 to go high and signal Q2 to go low. When signal Q1 (which is also signal TRUEEN) goes high, passgate 303 is enabled and the clock divider circuit enters the "TRUE" mode.

The next rising edge of input clock signal CLKIN is passed to the CLKOUT terminal. At time T6, the rising clock edge also generates a pulse on signal PULSE, which causes signal Q1 to go low and the clock divider circuit to return to the OFF mode. The cycle shown as period "P1" in FIG. 3C then repeats, for example, as period P2 between times T6 and T7. The cycle continues until signal DIVENB goes high again.

Note that the delay through clock divider circuit 300 for a rising clock edge includes only the delay through passgate 303. The delay through clock divider circuit 300 for a falling clock edge includes only the delay through inverter 301 and passgate 302. Therefore, the clock delay of clock divider circuit 300 is significantly shorter than the clock delay through traditional clock divider circuits.

The novel circuit configuration of FIG. 3 has an additional advantage. In conventional clock dividers, the clock signal follows the same path through the divider for both falling and rising edges of the clock. Therefore, the circuit cannot be optimized for both edges. Instead, some compromise must be reached that provides acceptable performance on both edges of the clock. However, in the circuit shown in FIG. 3, passgates 302 and 303 are separately controlled. Therefore, the controlling transistors can each be optimized for the corresponding clock edge.

In other words, a rising edge on output clock signal CLKOUT is controlled by passgate 303, while a falling edge on output clock signal CLKOUT is controlled by inverter 301 and passgate 302. Therefore, passgate 303 can be optimized to improve the performance of the rising edge of output clock signal CLKOUT, while inverter 301 and passgate 302 can be optimized to improve the performance of the falling edge of output clock signal CLKOUT. This optimization can be achieved, for example, through well-known methods involving circuit simulations performed on a computer. One example of such optimization is the use of a CMOS passgate to implement passgate 303 and an N-channel transistor to implement passgate 302 in the embodiment of FIG. 3.

For all of these reasons, the clock delay through clock divider circuit 300 can be significantly less than the delay through conventional clock divider circuits. For example, the delay added to a clock divider circuit using a conventional clock divider is typically about 500 picoseconds. However, when the same manufacturing technology is used, the delay added when using clock divider 300 can be as little as 90 picoseconds.

Figure 4A:
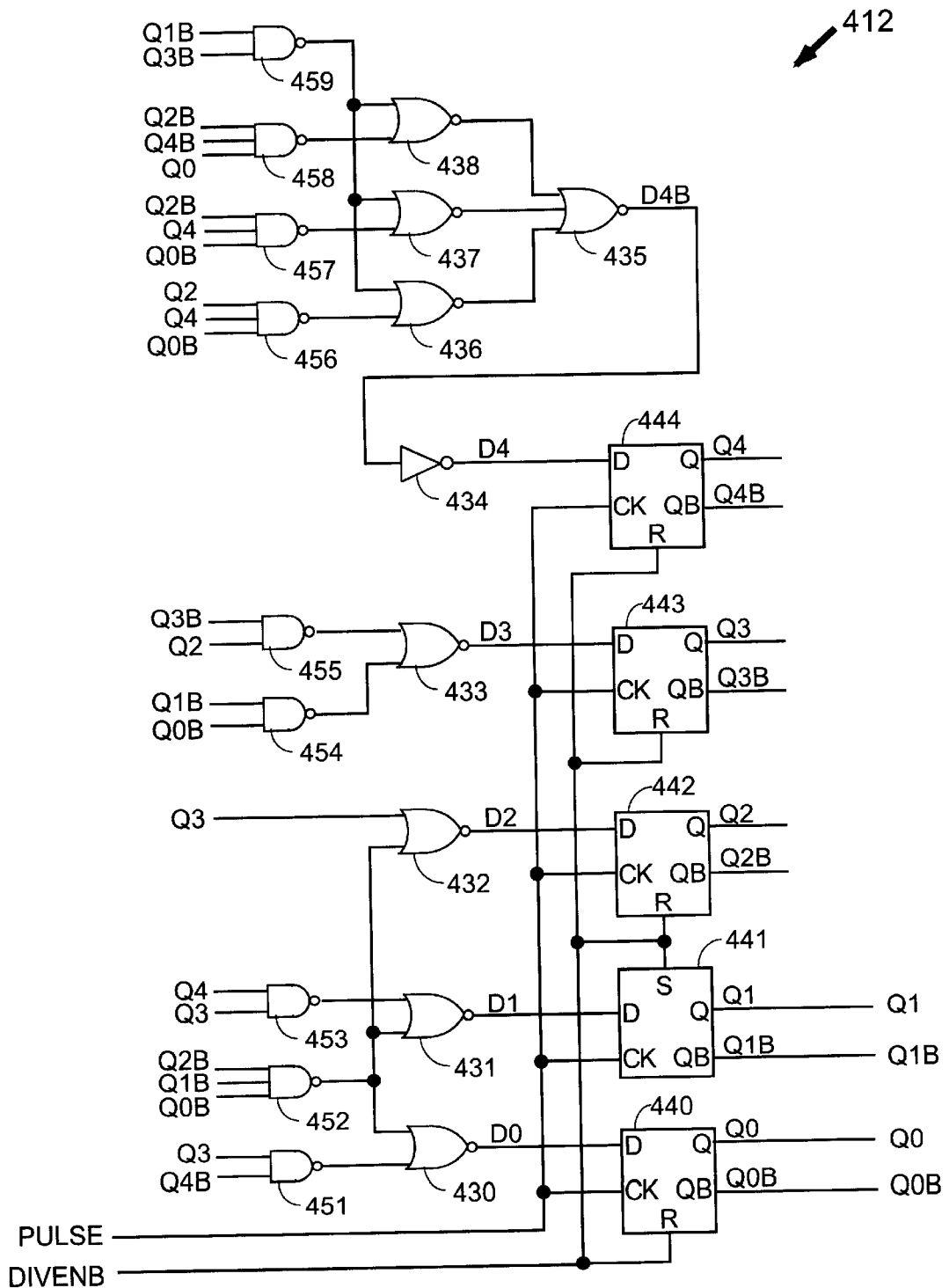
FIG. 4A shows one embodiment of a control circuit that can be used with the embodiment of FIG. 3 to implement a divide-by-four clock divider circuit.

The control circuit implementation shown in FIG. 3B can be applied to the clock divider circuit of FIG. 3 to provide a divide-by-two function. However, by using other control circuits, other divisors can be provided. For example, FIG. 4A shows a control circuit 412 that can be used with clock divider circuit 300 of FIG. 3 to implement a divide-by-four function.

Control circuit 412 is a state machine having eight different states when enabled. The sequence of states followed by control circuit 412 is shown in Table 2.

TABLE 2

| DIVENB | Q4 | Q3 | Q2 | Q1 | Q0 | D4 | D3 | D2 | D1 | D0 | Selected Clock |
|---|---|---|---|---|---|---|---|---|---|---|---|
| 1 | 0 | 0 | 0 | 1 | 0 | x | x | x | x | x | True |
| 0 | 0 | 0 | 0 | 1 | 0 | 0 | 0 | 0 | 0 | 0 | True |
| 0 | 0 | 0 | 0 | 0 | 0 | 0 | 0 | 1 | 0 | 0 | Off |
| 0 | 0 | 0 | 1 | 0 | 0 | 0 | 1 | 0 | 0 | 0 | Off |
| 0 | 0 | 1 | 0 | 0 | 0 | 0 | 0 | 0 | 0 | 1 | Off |
| 0 | 0 | 0 | 0 | 0 | 1 | 1 | 0 | 0 | 0 | 0 | Complement |
| 0 | 1 | 0 | 0 | 0 | 0 | 1 | 0 | 1 | 0 | 0 | Off |
| 0 | 1 | 0 | 1 | 0 | 0 | 1 | 1 | 0 | 0 | 0 | Off |
| 0 | 1 | 1 | 0 | 0 | 0 | 0 | 0 | 0 | 1 | 0 | Off |

The control circuit 412 shown in FIG. 4A includes five flip-flops 440–444 providing signals Q0–Q4, respectively. Signals Q0 and Q2–Q4 are initialized to low values, and signal Q1 is initialized to a high value, when enable signal DIVENB is high. NOR gates 430–433 and inverter 434 provide the next state values D0–D4, respectively, for flip-flops 440–444.

NOR gate 430 and NAND gates 451, 452 implement the function ((Q3*Q4B)'+(Q2B*Q1B*Q0B)')'. NOR gate 431 and NAND gates 452, 453 implement the function ((Q2B*Q1B*Q0B)'+(Q4*Q3)')'. NOR gate 432 and NAND gate 452 implement the function ((Q2B*Q1B*Q0B)'+Q3)'. NOR gate 433 and NAND gates 454, 455 implement the function ((Q1B*Q0B)'+(Q3B*Q2)')'. Inverter 434, NOR gates 435–438, and NAND gates 456–459 implement the function (((Q2*Q4*Q0B)'+(Q1B*Q3B)')'+((Q2B*Q4*Q0B)'+(Q1B*Q3B)')'+((Q2B*Q4B*Q0)'+(Q1B*Q3B)')').

Figure 4B:
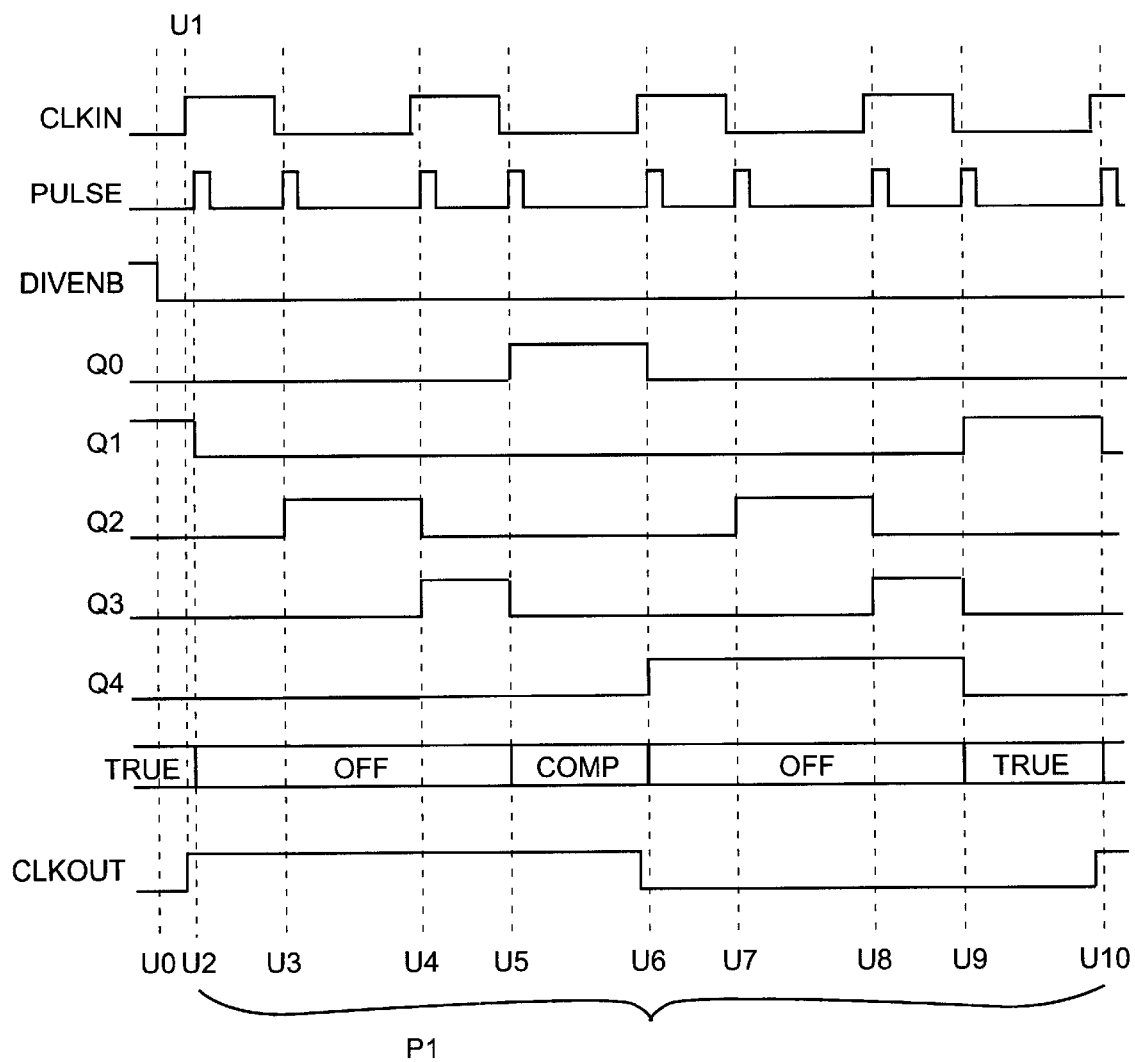
FIG. 4B is a timing diagram for the clock divider circuit of FIG. 3 when the control circuit of FIG. 4A is used.

FIG. 4B shows how the sequence of states shown in Table 2 results in a divide-by-four function for clock divider circuit 300 of FIG. 3. As with control circuit 312 of FIG. 3B, at any given time the clock divider circuit that uses control circuit 412 is operating in either a TRUE mode, a COMP mode, or an OFF mode.

Control circuit 412 differs from control circuit 312 in that the number of OFF states is increased from two to six. As can be seen from the waveforms of FIG. 4B, this increased number of OFF states results in a CLKOUT output waveform having twice the period of that shown in FIG. 3C.

As will be clearly understood by those of skill in the relevant arts, the exemplary state machines shown in FIGS. 3B and 4A are only two examples of state machines that can be used to implement clock divider circuits. For example, Table 3 shows a state table for a state machine having twelve different states when enabled. When used with clock divider circuit 300 of FIG. 3, the state machine of Table 3 results in a divide-by-six clock divider circuit.

TABLE 3

| DIVENB | Q5 | Q4 | Q3 | Q2 | Q1 | Q0 | D5 | D4 | D3 | D2 | D1 | D0 | Selected Clock |
|---|---|---|---|---|---|---|---|---|---|---|---|---|---|
| 1 | 0 | 0 | 0 | 0 | 1 | 0 | x | x | x | x | x | x | True |
| 0 | 0 | 0 | 0 | 0 | 1 | 0 | 0 | 0 | 0 | 0 | 0 | 0 | True |
| 0 | 0 | 0 | 0 | 0 | 0 | 0 | 0 | 0 | 0 | 1 | 0 | 0 | Off |
| 0 | 0 | 0 | 0 | 1 | 0 | 0 | 0 | 0 | 1 | 0 | 0 | 0 | Off |
| 0 | 0 | 0 | 1 | 0 | 0 | 0 | 0 | 0 | 1 | 1 | 0 | 0 | Off |
| 0 | 0 | 0 | 1 | 1 | 0 | 0 | 0 | 1 | 0 | 0 | 0 | 0 | Off |
| 0 | 0 | 1 | 0 | 0 | 0 | 0 | 0 | 0 | 0 | 0 | 0 | 1 | Off |
| 0 | 0 | 0 | 0 | 0 | 0 | 1 | 1 | 0 | 0 | 0 | 0 | 0 | Complement |
| 0 | 1 | 0 | 0 | 0 | 0 | 0 | 1 | 0 | 0 | 1 | 0 | 0 | Off |

TABLE 3-continued

| DIVENB | Q5 | Q4 | Q3 | Q2 | Q1 | Q0 | D5 | D4 | D3 | D2 | D1 | D0 | Selected Clock |
|---|---|---|---|---|---|---|---|---|---|---|---|---|---|
| 0 | 1 | 0 | 0 | 1 | 0 | 0 | 1 | 0 | 1 | 0 | 0 | 0 | Off |
| 0 | 1 | 0 | 1 | 0 | 0 | 0 | 1 | 0 | 1 | 1 | 0 | 0 | Off |
| 0 | 1 | 0 | 1 | 1 | 0 | 0 | 1 | 1 | 0 | 0 | 0 | 0 | Off |
| 0 | 1 | 1 | 0 | 0 | 0 | 0 | 0 | 0 | 0 | 0 | 1 | 0 | Off |

Figure 5:
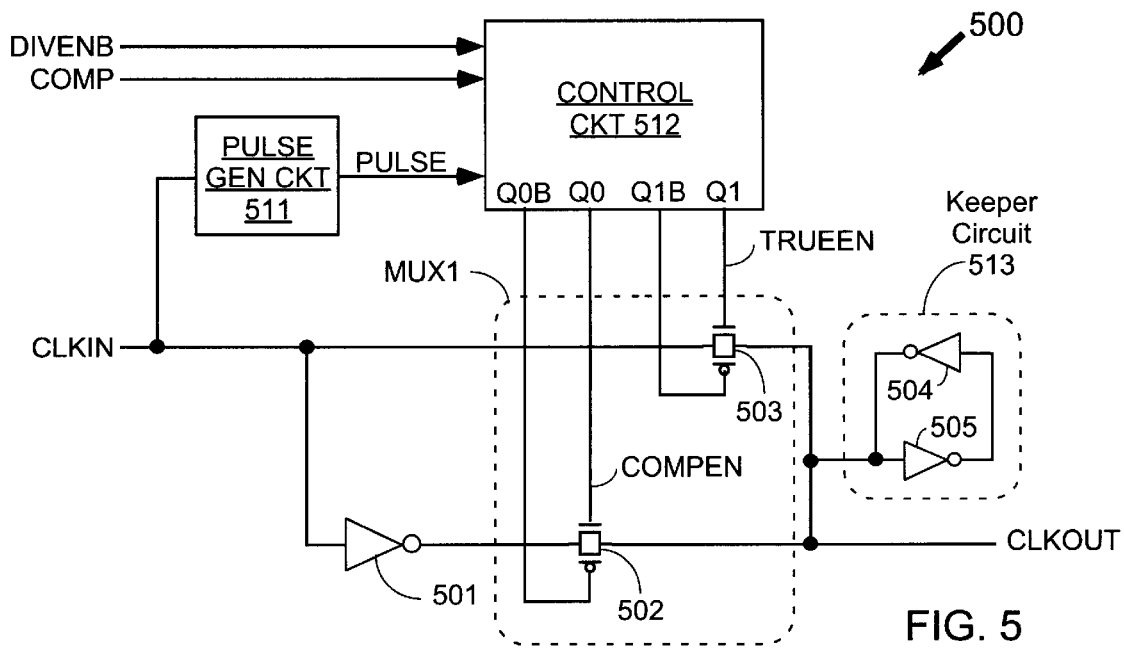
FIG. 5 is a block diagram of a clock divider circuit according to a third embodiment of the invention.

FIG. 5 shows a clock divider circuit 500 according to another embodiment of the invention. Clock divider circuit 500 is similar to clock divider circuit 300 of FIG. 3, except that multiplexer circuit MUX1 is implemented using two CMOS passgates 502, 503. Thus, an additional control signal Q0B is required. For simplicity, other portions of circuit 500 similar to those previously described in connection with FIG. 3 are not further described.

If the same control circuits are used in FIGS. 3 and 5, the circuits will behave similarly. However, because passgate 502 is a CMOS passgate, both rising and falling edges can quickly be passed through passgate 502, and both edges can overcome the weak driver 504 in keeper circuit 513. Therefore, clock divider circuit 500 can have an added capability. When the clock divider function is disabled, the circuit of FIG. 5 can optionally pass either the true or the complement version of input clock signal CLKIN to output terminal CLKOUT. In the illustrated embodiment, when select signal COMP is high, the complement version of input clock signal CLKIN is passed. When select signal COMP is low, the true version of input clock signal CLKIN is passed to output terminal CLKOUT.

Clock divider divide-by-two circuits can advantageously be included in PLDs, dividing down the input clock for distribution within the PLD, then doubling the clock frequency again only where required by the user logic. Another capability typically included in PLDs is the ability to programmably invert the input clock prior to distribution. This capability is typically provided by routing the clock signal through a multiplexer controlled by a configuration memory cell to select either the true or the complement clock signal. Note that the embodiment of FIGS. 5 and 5A provides this true/complement select capability and the selectable divide-by-two capability as well, with no more delay than with the simple multiplexer circuit of the prior art.

In one embodiment, clock divider circuit 500 is included in a PLD, and the COMP select signal is provided by a configuration memory cell.

Figure 5A:
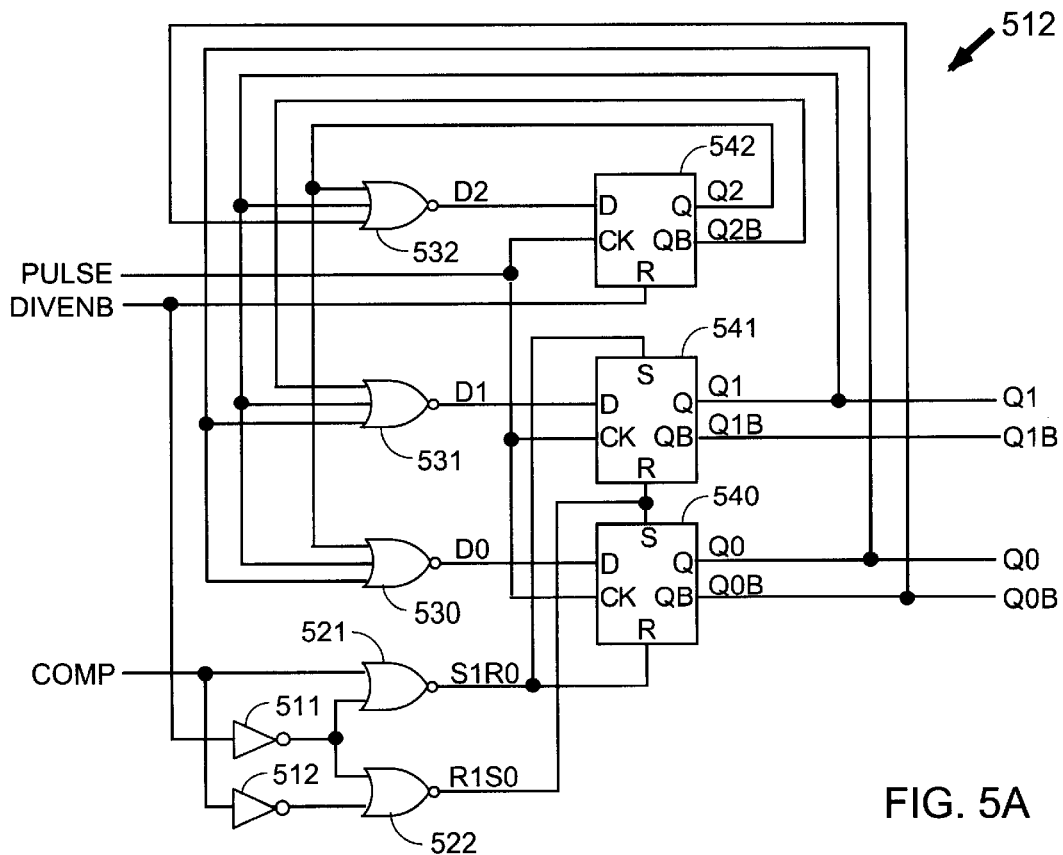
FIG. 5A shows one embodiment of a control circuit that can be used with the embodiment of FIG. 5 to implement a second divide-by-two clock divider circuit.

FIG. 5A shows one implementation of control circuit 512, where the control circuit is implemented as a state machine similar to that of FIG. 3B. Flip-flops 540–542 and NOR gates 530–532 are coupled together in a fashion similar to that of control circuit 312 of FIG. 3B. However, the set and reset signals of flip-flops 540 and 541 are derived differently, to accommodate the additional functionality. Table 4 shows the functionality of control circuit 512 of FIG. 5A.

TABLE 4

| DIVENB | COMP | Q2 | Q1 | Q0 | D2 | D1 | D0 | Selected Clock |
|---|---|---|---|---|---|---|---|---|
| 1 | 1 | 0 | 0 | 1 | x | x | x | Comp |
| 1 | 0 | 0 | 1 | 0 | x | x | x | True |
| 0 | x | 0 | 1 | 0 | 0 | 0 | 0 | True |
| 0 | x | 0 | 0 | 0 | 0 | 0 | 1 | Off |

TABLE 4-continued

| DIVENB | COMP | Q2 | Q1 | Q0 | D2 | D1 | D0 | Selected Clock |
|---|---|---|---|---|---|---|---|---|
| 0 | x | 0 | 0 | 1 | 1 | 0 | 0 | Complement |
| 0 | x | 1 | 0 | 0 | 0 | 1 | 0 | Off |

When the divide-by-two function is enabled (i.e., signal DIVENB is low), inverter 511 provides a high value to NOR gates 521 and 522, driving set/reset signals S1R0 and R1S0 low, respectively. Thus, select signal COMP is a don't-care value. When the divide-by-two function is disabled (i.e., signal DIVENB is high), the value of select signal COMP determines the values of set/reset signals S1R0 and R1S0.

When signal DIVENB is high and signal COMP is high (i.e., the complement clock signal is selected), NOR gate 521 drives set/reset signal S1R0 low, while inverter 512 provides a low value to NOR gate 522. Because signal DIVENB is high, inverter 511 also provides a low value, and NOR gate 522 drives set/reset signal R1S0 high. Flip-flop 540 sets signal Q0 high, while flip-flop 541 resets signal Q1 low. Passgate 502 is enabled to pass the complement clock signal, while passgate 503 is disabled.

When signal DIVENB is high and signal COMP is low (i.e., the true clock signal is selected), inverter 512 provides a high value to NOR gate 522, which drives set/reset signal R1S0 low. Because signal DIVENB is high, inverter 511 also provides a low value, and NOR gate 521 drives set/reset signal S1R0 high. Flip-flop 540 resets signal Q0 low, while flip-flop 541 sets signal Q1 high. Passgate 503 is enabled to pass the true clock signal, while passgate 502 is disabled.

As has been demonstrated by the above examples, many different control circuits can be used with the clock divider circuits of the invention, imparting different capabilities to the circuits. For example, in the embodiments described above, the control circuit accommodates only one divisor. In other embodiments (not shown), the control circuit is implemented as a programmable state machine supporting a plurality of divisors.

In some embodiments, the clock divider circuit of the invention forms a portion of a programmable logic device (PLD) such as a field programmable gate array (FPGA) or a complex programmable logic device (CPLD). In one such embodiment, the control circuit is implemented using user-controlled programmable logic to perform a specific function in a particular design, and supports only one divisor.

In another PLD embodiment, the control circuit is implemented in dedicated logic (i.e., not using the user-controlled logic blocks). This dedicated logic, however, can be designed to be programmable. For example, in some embodiments a clock divider circuit is implemented in dedicated logic in a PLD. The clock divider circuit includes a state machine that is configurable to support any of several divisors.

In one such embodiment, where the PLD is a CPLD, the state machine is controlled by logic values stored in FLASH memory using the typical programming process for the CPLD. In this embodiment, the logic values are included in the CPLD configuration data file. In another such embodiment, where the PLD is an FPGA, the state machine is controlled by logic values stored in SRAM cells during the normal configuration process for the FPGA. In this embodiment, the logic values are loaded as part of a configuration bitstream.

Figure 6:
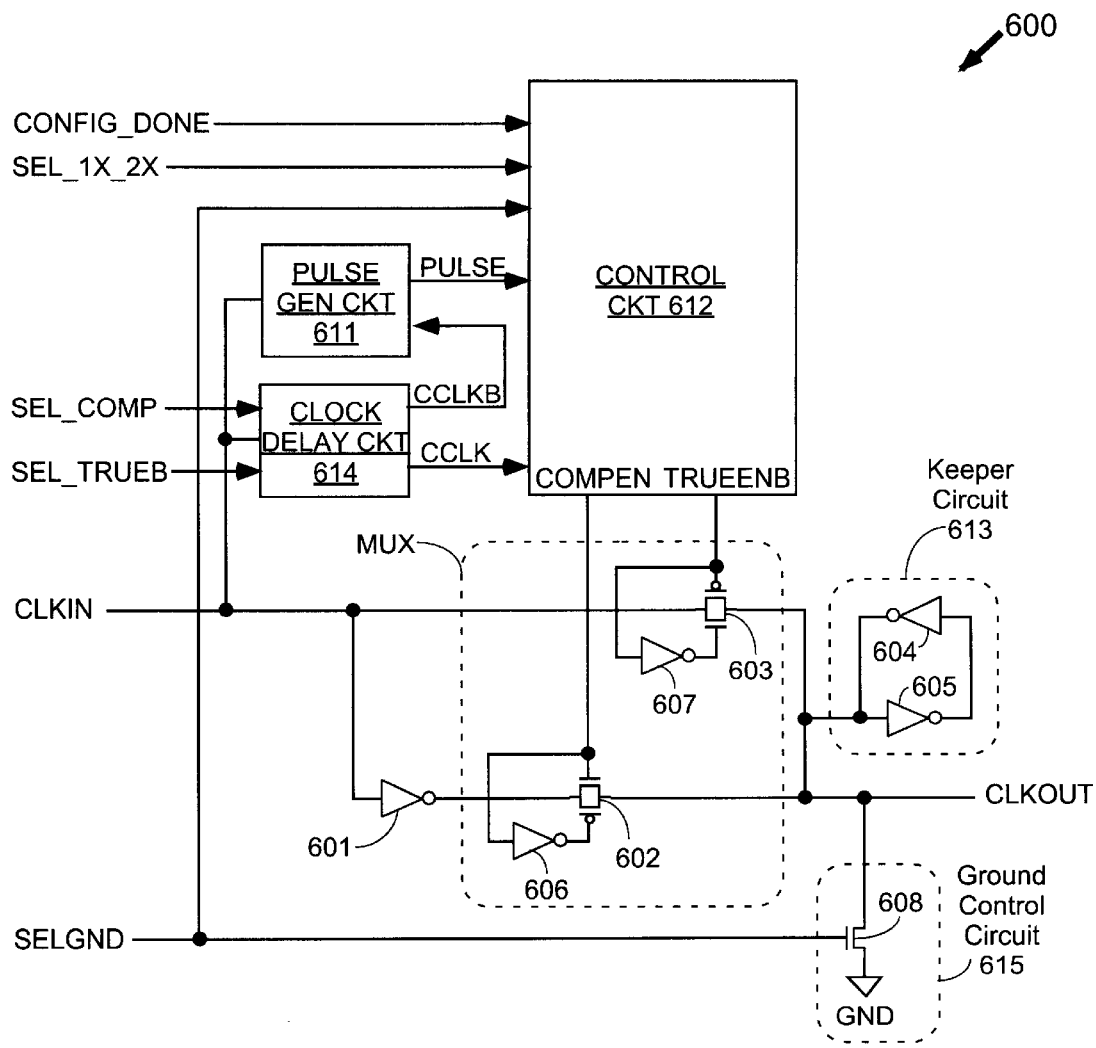
FIG. 6 is a block diagram of a first digital frequency synthesizer (DFS) circuit according to another embodiment of the invention.

The principles of the invention can also be applied to clock generator circuits having additional capabilities, such as the digital frequency synthesizer (DFS) circuit of FIG. 6.

Referring now to FIG. 6, DFS circuit 600 includes a pulse generator circuit 611, a clock delay circuit 614, a control circuit 612, a multiplexer circuit MUX, an inverter 601, a keeper circuit 613, and a ground control circuit 615.

In the pictured embodiment, multiplexer circuit MUX includes two passgates 602 and 603 controlled by control circuit 612. Signal TRUEENB from control circuit 612 enables passgate 603, which passes the input clock signal CLKIN. Signal COMPEN from control circuit 612 enables passgate 602, which passes the complement of input clock signal CLKIN (inverted by inverter 601). In the pictured embodiment, both passgates are implemented as CMOS passgates. However, other types of passgates can also be used. Other types of multiplexer circuits can also be substituted for multiplexer circuit MUX. Additionally, as is well known in the art, control signals COMPEN and/or TRUEENB can be provided in inverted form and the gate terminals of passgates 602 and 603 can be changed to maintain the same functionality.

Keeper circuit 613 is coupled to output terminal CLKOUT. In the pictured embodiment, keeper circuit 613 is similar to keeper circuit 313 of FIG. 3. However, any keeper circuit can be used in DFS circuit 600, as long as it is weak enough to be overridden by each of passgates 602 and 603.

Ground control circuit 615 is implemented in the pictured embodiment as a pull-down (e.g., an N-channel transistor to ground) controlled by a ground select signal SELGND. When ground select signal SELGND is high, the output terminal CLKOUT is always low.

In another embodiment (not shown) ground control circuit 615 is replaced by (or enhanced by the addition of) a power high control circuit, e.g., a pull-up (P-channel transistor to power high) controlled by a power high select signal SELVDDB. When power high select signal SELVDDB is low, the output terminal CLKOUT is always high.

Pulse generator circuit 611 provides an output pulse in response to each rising and falling edge of input clock signal CLKIN. (See, for example, the waveforms for signals CLKIN and PULSE provided in FIG. 3C.) Pulse generator circuit 611 can be implemented, for example, as shown in FIG. 3A. However, in one embodiment, pulse generator circuit 611 is implemented as shown in FIG. 6A.

Figure 6A:
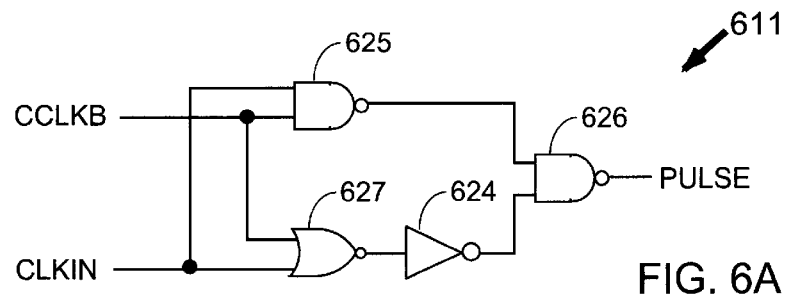
FIG. 6A shows one embodiment of a pulse generator circuit that can be used with the embodiment of FIG. 6.

FIG. 6A shows an embodiment of pulse generator circuit 611 that includes inverter 624, NOR gate 627, and NAND gates 625–626. Input clock signal CLKIN drives both NAND gate 625 and NOR gate 627. Delayed and inverted clock signal CCLKB (provided by clock delay circuit 614 in FIG. 6) also drives both NAND gate 625 and NOR gate 627. NAND gate 626 is driven by NAND gate 625 and also by NOR gate 627 inverted by inverter 624. The output of NAND gate 626 is the PULSE signal, which is provided to control circuit 612 in FIG. 6.

Figure 6B:
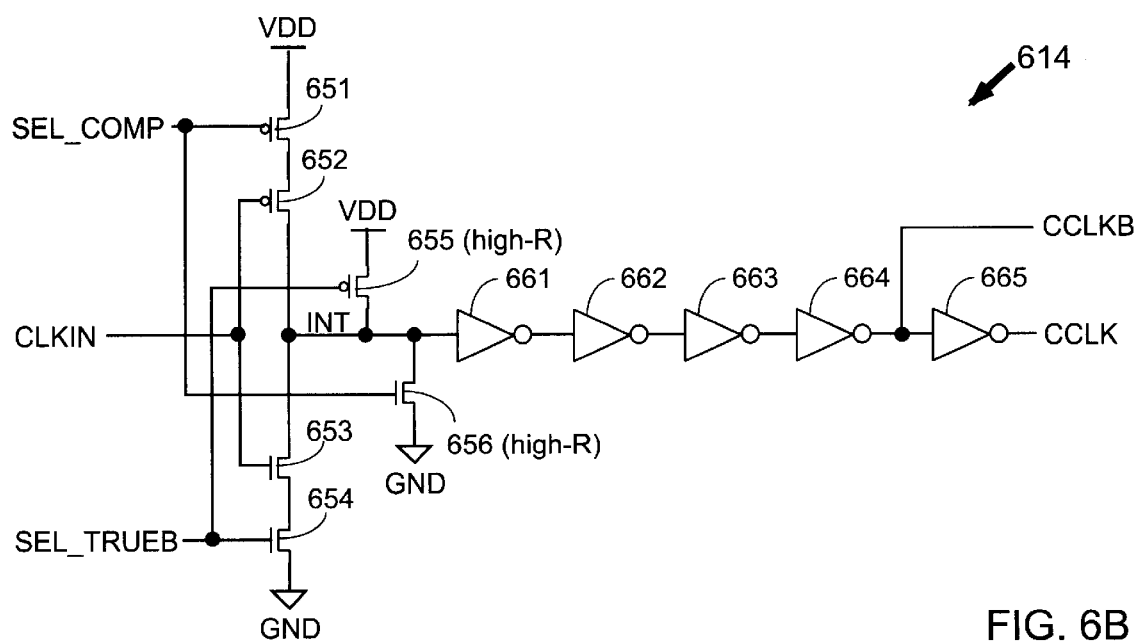
FIG. 6B shows one embodiment of a clock delay circuit that can be used with the embodiment of FIG. 6.

FIG. 6B shows an embodiment of clock delay circuit 614, which delays and inverts the input clock signal CLKIN. The pictured embodiment of clock delay circuit 614 includes P-channel transistors 651–652 and 655, N-channel transistors 653–654 and 656, and inverters 661–665.

Transistors 651–652 are coupled in series between power high VDD and an internal node INT; while transistors 653–654 are coupled in series between node INT and ground GND. Transistor 655 is a high-resistance P-channel transistor coupled between node INT and power high VDD. Transistor 656 is a high-resistance N-channel transistor coupled between node INT and ground GND. Transistors 652 and 653 are driven by input clock signal CLKIN; transistors 651 and 656 are driven by complement select signal SEL_COMP; and transistors 654 and 655 are driven by true select signal SEL_TRUEB.

Internal node INT drives inverter 661, which forms the first of a series of five inverters 661–665 coupled in series. Other embodiments of the invention include other numbers of inverters in the series, the number being selected (e.g., via circuit simulation) to function properly at the desired maximum input clock frequency. Inverter 664 provides delayed and inverted clock signal CCLKB to pulse generator circuit 611 in FIG. 6. Inverter 665 provides clock signal CCLK to control circuit 612 in FIG. 6.

When signal SEL_1X_2X is high, select signals SEL_COMP and SEL_TRUEB control whether the output signal CLKOUT is the true or the complement of the input clock signal CLKIN. When signal SEL_1X_2X is low, clock delay circuit 614 of FIG. 6B functions only as a delay circuit. Therefore, signal SEL_COMP is configured to be low, and signal SEL_TRUEB is configured to be high.

If signal SEL_COMP were high and SEL_TRUEB were low, both transistors 655 and 656 would be on, and internal node INT would be at some intermediate state. Thus, this combination of select values is not allowed.

Figure 6D:
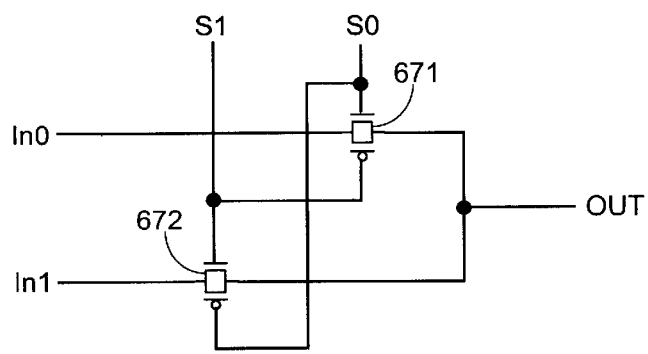
FIG. 6D shows one embodiment of a multiplexer circuit that can be used in the control circuit of FIG. 6C.
Figure 6C:
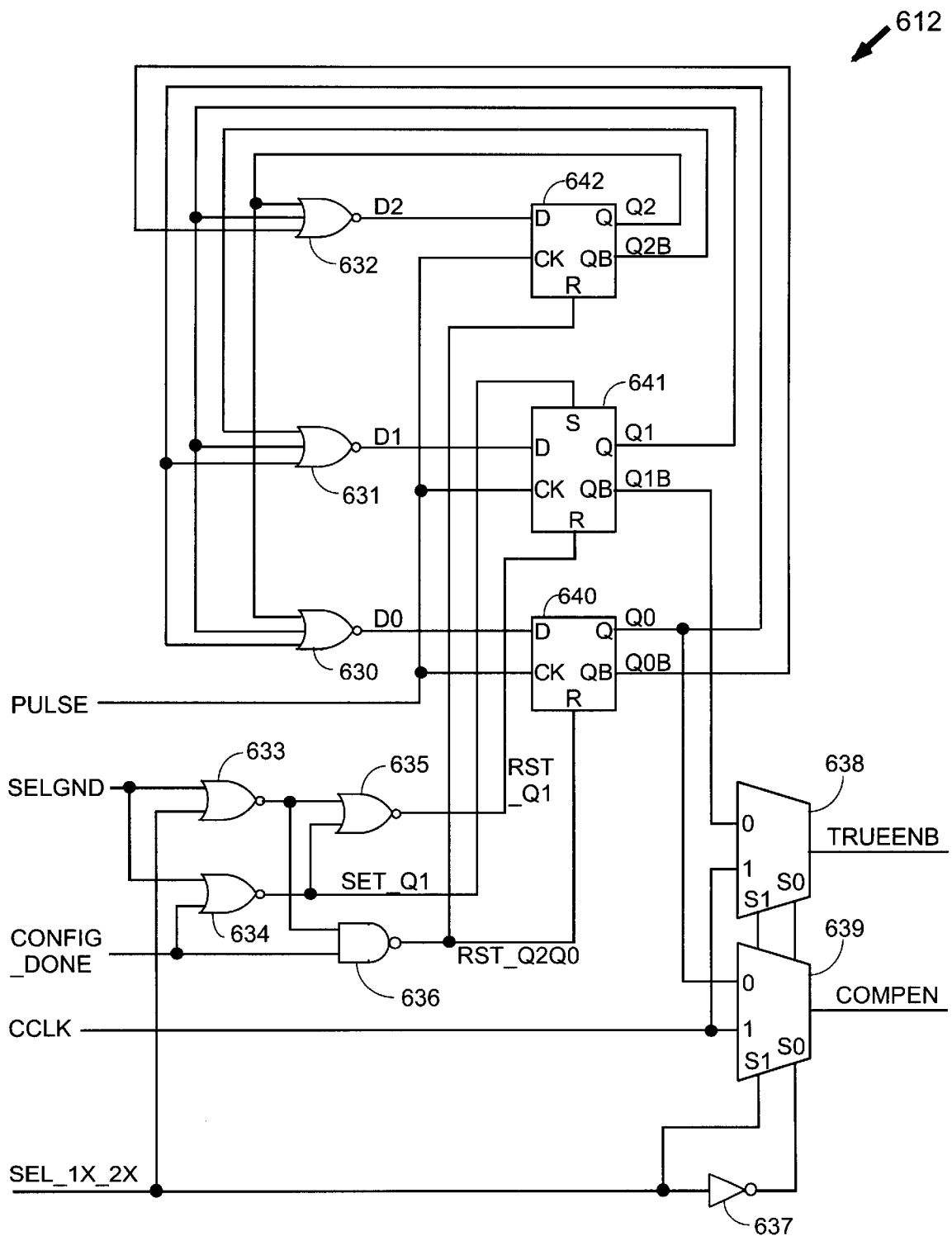
FIG. 6C shows one embodiment of a control circuit that can be used with the embodiment of FIG. 6.

FIG. 6C shows one embodiment of control circuit 612. Many different control circuits can be used, such as those described above in conjunction with FIG. 3B and 4A. For example, control circuits can be used that support even divisors greater than two, as described above in conjunction with FIG. 4A. However, the embodiment of control circuit 612 shown in FIG. 6C is similar to control circuit 312 of FIG. 3B and control circuit 512 of FIG. 5A. For example, the sequence of states is the same as that shown in Table 1. Therefore, only the differences between the two circuits are described here.

Table 5 shows how the various select signals provided to control circuit 612, clock delay circuit 614, and ground control circuit 615 affect the functionality of DFS circuit 600 in FIG. 6. When signal SELGND is high (output signal CLKOUT is forced low), signals SEL_COMP and SEL_TRUEB can have any permitted combination of values. However, values of 0,0 or 1,1 are preferred, as these values tristate the buffer formed by transistors 651–654 in FIG. 6B and therefore reduce power consumption.

TABLE 5

| CONFIG DONE | SEL_ 1X 2X | SEL GND | SEL_ COMP | SEL_ TRUEB | CLKOUT FUNCTION |
|---|---|---|---|---|---|
| 0 | 0 | 0 | 0 | 1 | Non-inverted CLKIN during power-up |
| 1 | 1 | 0 | 0 | 1 | CLKIN * 2 |
| 1 | 1 | 0 | 0 | 0 | CLKIN |
| 1 | 1 | 0 | 1 | 1 | Inverted CLKIN |
| 1 | 0 | 0 | 0 | 1 | CLKIN/2 on rising edge |
| 1 | 0 | 1 | 1 | 1 | GND |

Signal CONFIG_DONE is low during power-up, and goes high when the power high signal reaches a valid operating level for a non-programmable IC, or when the configuration process is complete for a programmable IC. Select signal SEL_1X_2X is set low to select a divide-by-two or ground function, and is set high to select a same-frequency or multiply-by-two function. Select signal SEL-GND is set high to force the output clock signal low.

The set/reset circuitry of control circuit 612 is more complicated than that of control circuit 312 (FIG. 3B), being controlled by several select signals instead of one. The set/reset circuitry places the control circuit in the correct state for each selected function (see Table 5). The set/reset circuitry includes NOR gates 633–635 and NAND gate 636.

Signal RST_Q1 (on which a high value resets signal Q1 low) is provided by NOR gate 635, which in turn is driven by NOR gates 633 and 634. Signal SET_Q1 (on which a high value sets signal Q1 high) is provided by NOR gate 634, which is driven by signals SELGND and CONFIG_DONE. NOR gate 633 is driven by select signals SELGND and SEL_1X_2X. Signal RST_Q2Q0 (on which a high value resets signals Q2 and Q0 low) is provided by NAND gate 636, which is driven by NOR gate 633 and select signal CONFIG_DONE.

Control signals TRUEENB and COMPEN are provided to multiplexer circuit MUX by multiplexers 638 and 639, respectively, which are controlled by select signal SEL_1X_2X. Multiplexers 638 and 639 can be implemented, for example, as shown in FIG. 6D. Multiplexer 638 passes signal Q1B when select signal SEL_1X_2X is low, and signal CCLK when select signal SEL_1X_2X is high. Multiplexer 639 passes signal Q0 when select signal SEL_1X_2X is low, and signal CCLK when select signal SEL_1X_2X is high. Thus, when select signal SEL_1X_2X is high, this aspect of control circuit 612 functions the same way, for example, as control circuits 312 and 512.

FIG. 6D shows one embodiment of multiplexers 638 and 639 that can be used in the control circuit of FIG. 6C. When signal S0 is high, input signal In0 is passed to output OUT via passgate 671. When signal S1 is high, input signal In1 is passed to output OUT via passgate 672. When both signals S0 and S1 are low, output signal OUT is tristated. When both signals S0 and S1 are high, there is contention at the output node, so this combination is not supported.

Figure 7:
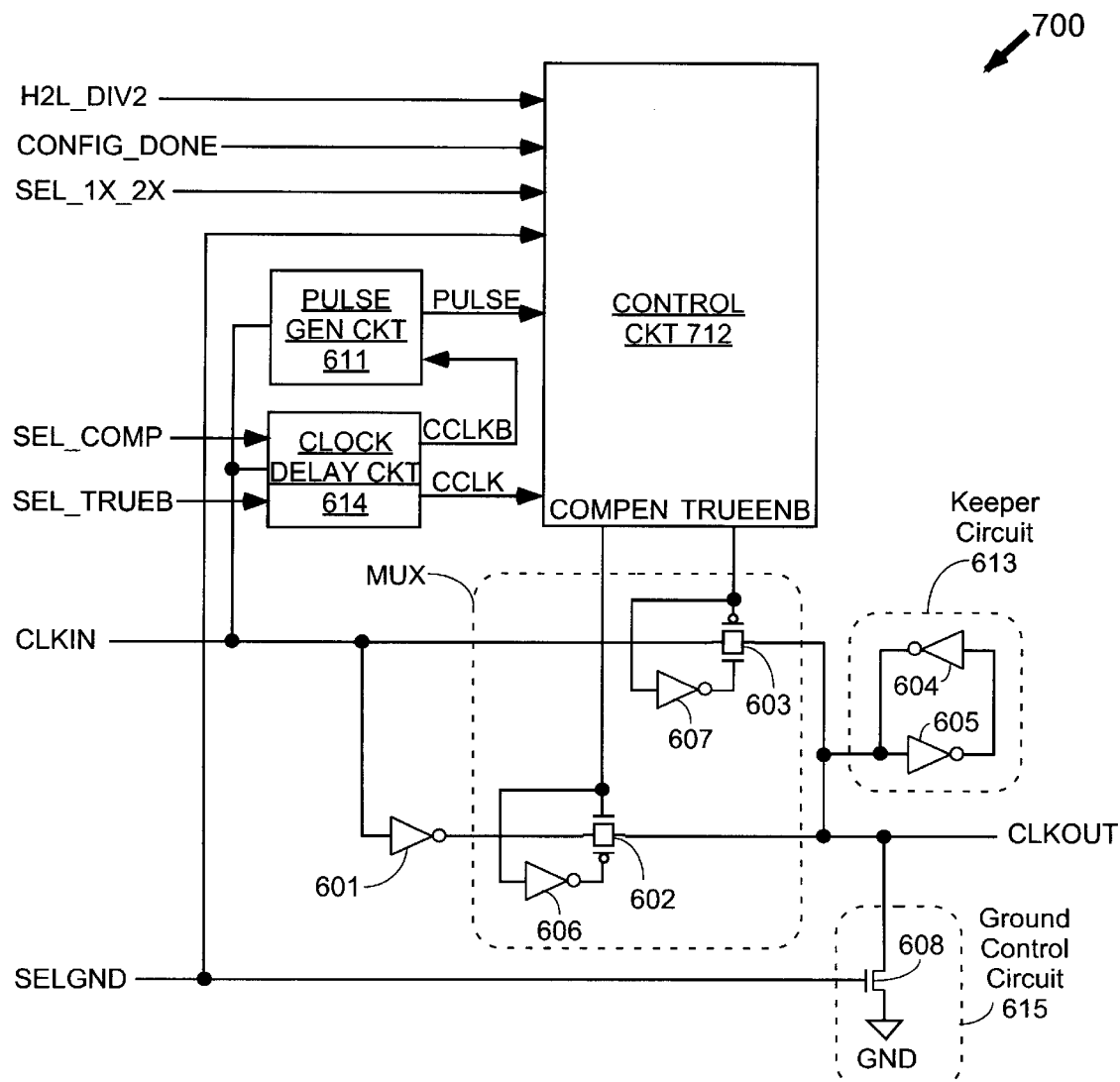
FIG. 7 is a block diagram of a second DFS circuit according to another embodiment of the invention.

FIG. 7 is a block diagram of a DFS circuit 700 according to another embodiment of the invention. DFS circuit 700 differs from DFS circuit 600 of FIG. 6 in that it includes an additional select signal H2L_DIV2, which is supplied to the control circuit 712. Select signal H2L_DIV2 allows the DFS circuit to align the clock edges of the divide-by-two output clock signal with either the rising or the falling edges of input clock signal CLKIN. Select signal H2L_DIV2 also controls whether the output signal is the non-inverted input clock signal CLKIN during power-up, or is tristated, as shown in Table 6.

In Table 6, when signal SELGND is high (output signal CLKOUT is forced low), signals SEL_COMP and SEL_TRUEB can have any permitted combination of values. However, values of 0,0 or 1,1 are preferred, as these values tristate the buffer formed by transistors 651–654 in FIG. 6B and therefore reduce power consumption.

TABLE 6

| CONFIG DONE | SEL_1X 2X | SEL GND | SEL_COMP | SEL_TRUEB | H2L_DIV2 | CLKOUT FUNCTION |
|---|---|---|---|---|---|---|
| 0 | 0 | 0 | 0 | 1 | 0 | Non-inverted CLKIN during power-up |
| 0 | 0 | 0 | 0 | 1 | 1 | No CLKIN (tristated) during power-up |
| 1 | 1 | 0 | 0 | 1 | 0 | CLKIN * 2 |
| 1 | 1 | 0 | 0 | 0 | 0 | CLKIN |
| 1 | 1 | 0 | 1 | 1 | 0 | Inverted CLKIN |
| 1 | 0 | 0 | 0 | 1 | 0 | CLKIN/2, rising edge |
| 1 | 0 | 0 | 0 | 1 | 1 | CLKIN/2, falling edge |
| 1 | 0 | 1 | 1 | 1 | 0 | GND |

In one embodiment, signal H2L_DIV2 is modified using signal CONFIG_DONE (e.g., using an AND function of signals H2L_DIV2 and CONFIG_DONE) to ensure that whenever signal CONFIG_DONE is low, modified signal H2L_DIV2 is also low. In this embodiment, signal CLKOUT always reflects the non-inverted CLKIN during power-up.

In another embodiment, signal H2L_DIV2 is modified using signal CONFIG_DONE (e.g., using an OR function of signal H2L_DIV2 and the inverse of signal CONFIG_DONE) to ensure that whenever signal CONFIG_DONE is low, modified signal H2L_DIV2 is high. In this embodiment, signal CLKOUT is always tristated during power-up.

Figure 7A:
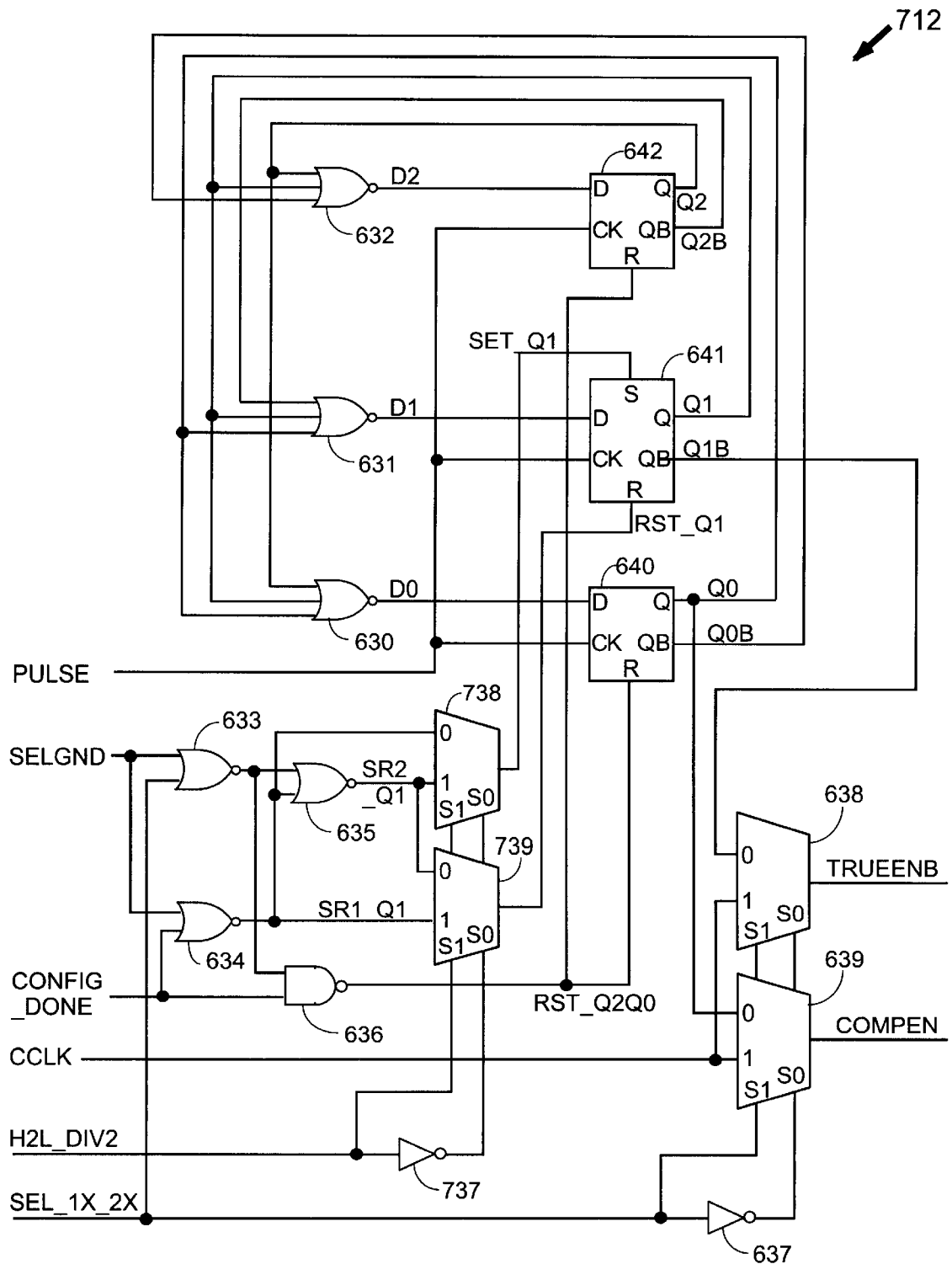
FIG. 7A shows one embodiment of a control circuit that can be used with the embodiment of FIG. 7.

FIG. 7A shows one embodiment of control circuit 712. As shown in FIG. 7A, select signal H2L_DIV2 controls multiplexers 738 and 739 to selectively exchange the values of signals SET_Q1 and RST_Q1 compared to control circuit 612 of FIG. 6C. Thus, by setting signal H2L_DIV2 high, the initial states of the flip-flops can be altered. As a result, the divide-by-two output clock signal is delayed such that the output clock signal changes state on falling edges of the input clock signal, rather than on the rising edges. This alteration affects the behavior during power-up as well as when the divide-by-two function is selected.

Figure 8:
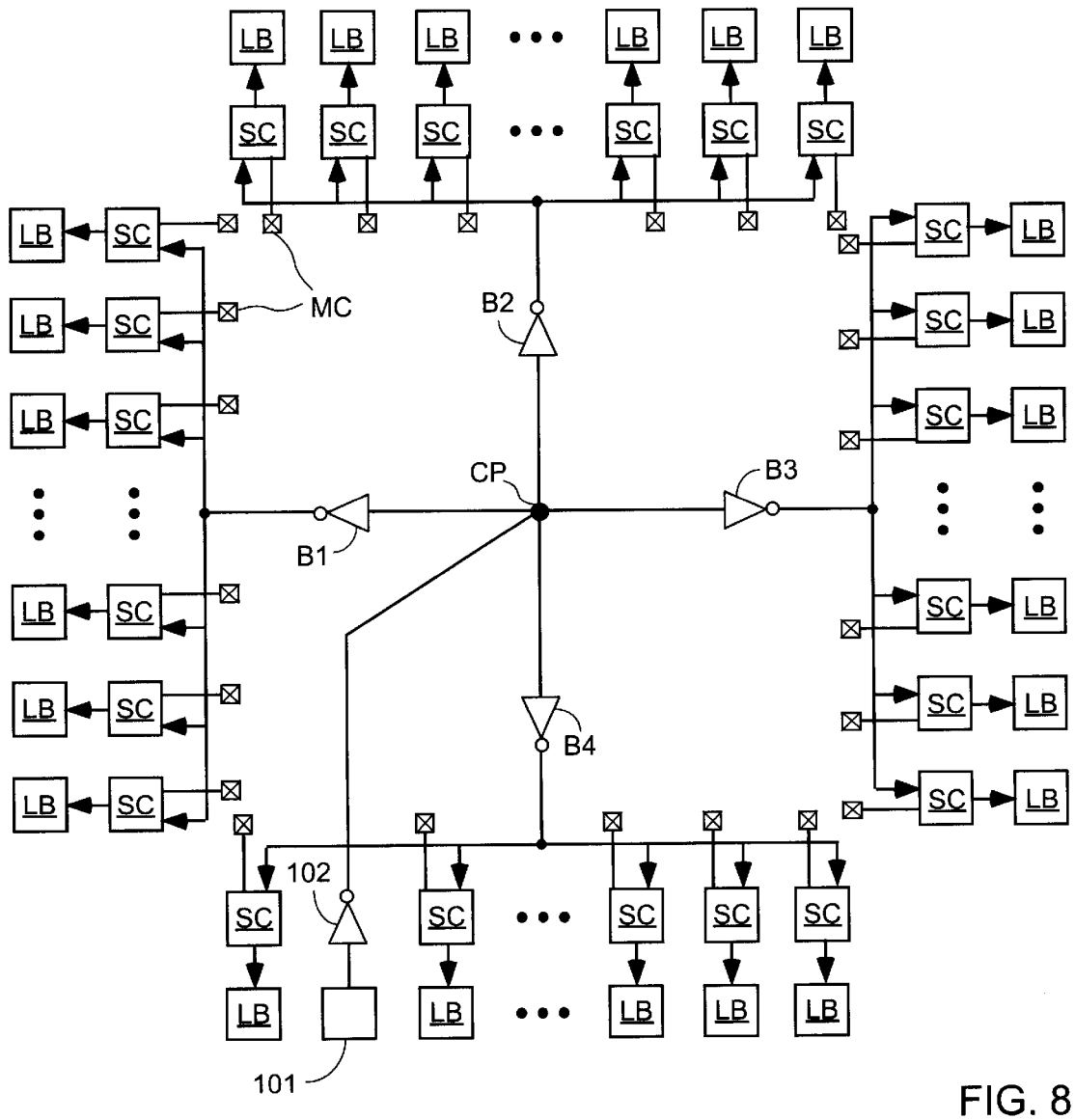
FIG. 8 is an architectural representation of a PLD according to one aspect of the invention.

FIG. 8 is an architectural representation of a PLD according to one aspect of the invention. The PLD of FIG. 8 makes use of the fact that the DFS circuit of the invention can provide a steady-state output signal, e.g., ground or power high or both.

Figure 2:
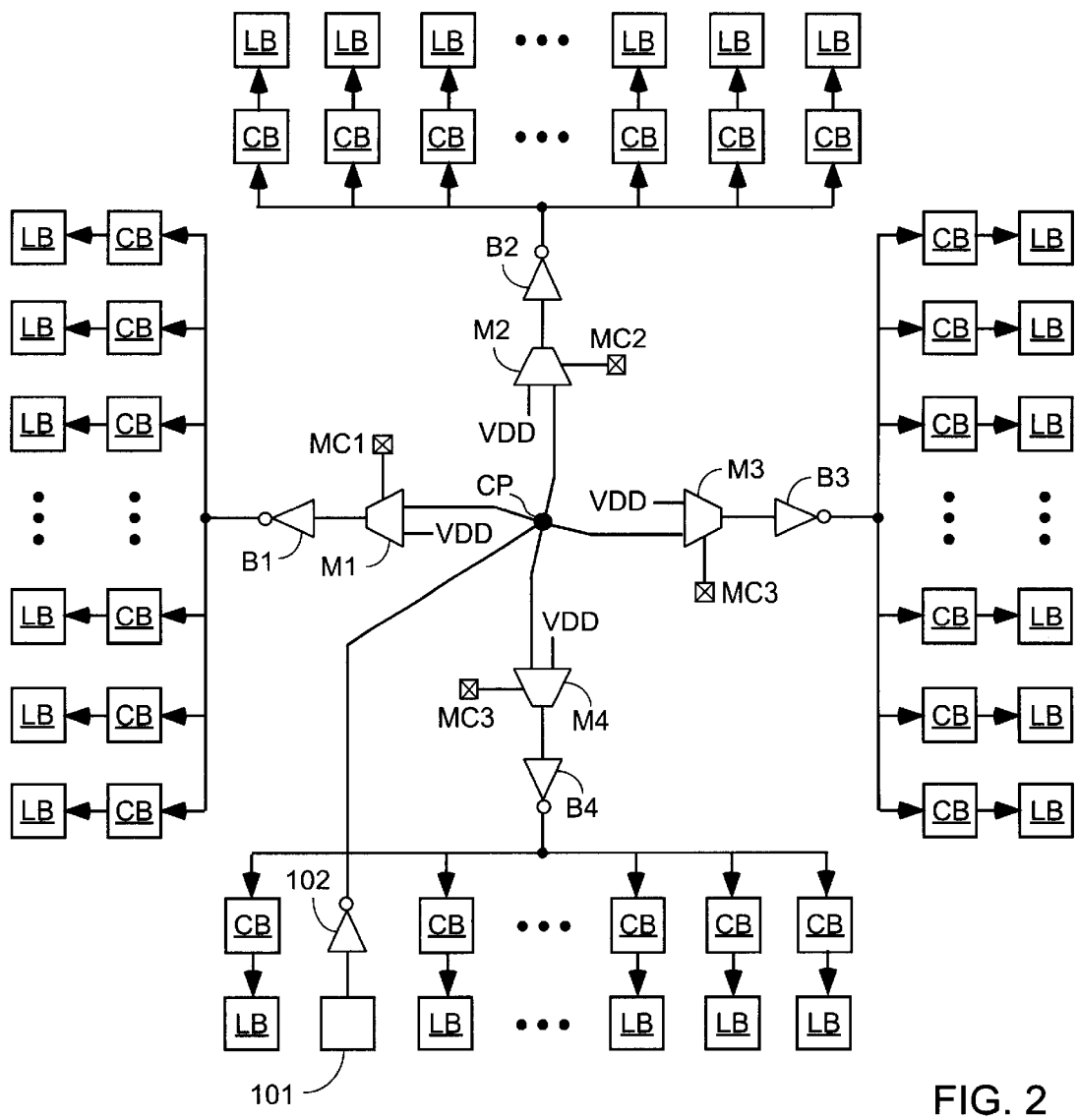
FIG. 2 is an architectural representation of a second prior art PLD, in which the programmable clock tree includes a clock buffer for each logic block.

The embodiment shown in FIG. 8 is similar to the PLD of FIG. 2, except that multiplexers M1–M4 are omitted and each clock buffer has been replaced by a programmable synthesizer circuit SC. Multiplexers M1–M4 are no longer necessary. Multiplexers M1–M4 were included to inhibit the clock signal driving the logic blocks in an entire quadrant of the chip. In the PLD of FIG. 8, the clock signal for each logic block can be controlled using the memory cell MC of the associated synthesizer circuit SC. For example, for any logic block LB that has no user logic implemented in the block, the associated synthesizer circuit SC can simply be programmed using memory cell MC to provide a steady-state signal (e.g., a ground signal) to the input clock terminal of the logic block.

In one embodiment, each memory cell MC is coupled to a SELGND input terminal of the associated synthesizer circuit.

Figure 1:
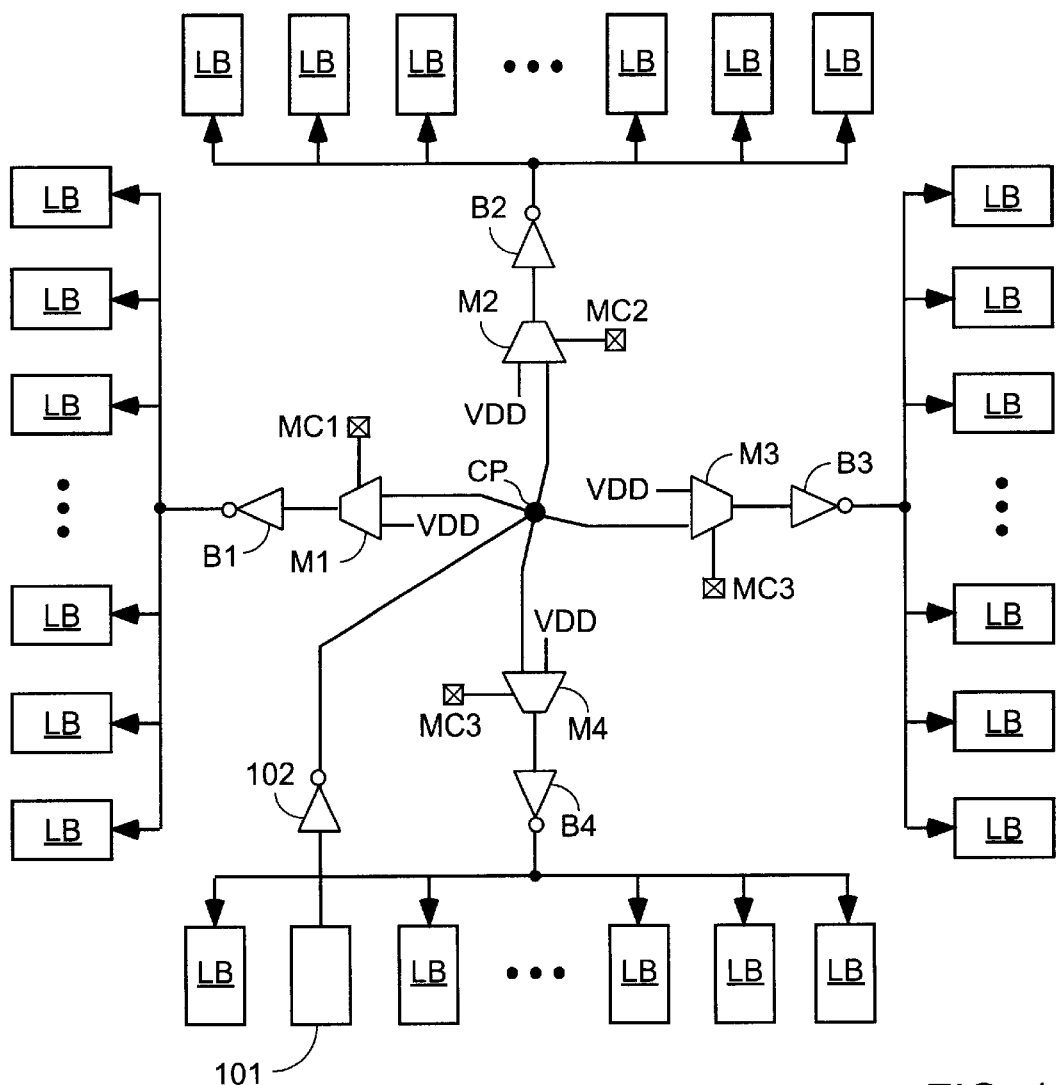
FIG. 1 is an architectural representation of a first prior art programmable logic device (PLD) including a programmable clock tree.

Either of DFS circuits 600 (FIG. 6) and 700 (FIG. 7) can be used to provide synthesizer circuits SC. However, DFS circuits 600 and 700 merely provide examples of circuits that can be used in this fashion. Therefore, the invention is not limited to PLDs using these circuits. For example, the "synthesizer circuit" could be simply a multiplexer similar to M1–M4 of FIGS. 1–2, or a multiplexer selecting between the signal from the secondary buffer B1–B4 and the ground signal.

Those having skill in the relevant arts of the invention will now perceive various modifications and additions that can be made as a result of the disclosure herein. For example, the above text describes the circuits and methods of the invention in the context of integrated circuits (ICs) such as programmable logic devices (PLDs). However, the circuits of the invention can also be implemented in other electronic systems, for example, in printed circuit boards and larger electronic systems.

Further, digital frequency synthesizer circuits, clock delay circuits, ground control circuits, pulse generator circuits, multiplexers, multiplexer circuits, control circuits, state machines, state machine circuits, keeper circuits, passgates, CMOS passgates, N-channel transistors, inverters, NAND gates, NOR gates, and other components other than those described herein can be used to implement the invention. Active-high signals can be replaced with active-low signals by making straightforward alterations to the circuitry, such as are well known in the art of circuit design.

Moreover, some components are shown directly connected to one another while others are shown connected via intermediate components. In each instance the method of interconnection establishes some desired electrical communication between two or more circuit nodes. Such communication can often be accomplished using a number of circuit configurations, as will be understood by those of skill in the art.

Accordingly, all such modifications and additions are deemed to be within the scope of the invention, which is to be limited only by the appended claims and their equivalents.

What is claimed is:

1. A digital frequency synthesizer (DFS) circuit, comprising:
   a true clock input terminal;
   a complement clock input terminal;
   an output clock terminal;
   a pulse generator circuit having an input terminal coupled to the true clock input terminal and further having an output terminal;
   a control circuit having a first input terminal coupled to the output terminal of the pulse generator circuit, a second input terminal coupled to the true clock input terminal, a ground select input terminal, and first and second output terminals;
   a first passgate coupled between the true clock input terminal and the output clock terminal, the first passgate having a control terminal coupled to the first output terminal of the control circuit;
   a second passgate coupled between the complement clock input terminal and the output clock terminal, the second passgate having a control terminal coupled to the second output terminal of the control circuit;
   a keeper circuit having an output terminal coupled to the output clock terminal; and
   a ground control circuit having a data terminal coupled to the output clock terminal and a control terminal coupled to the ground select input terminal of the control circuit.

2. The DFS circuit of claim 1, wherein the control circuit comprises means for selecting one of a signal on the true clock input terminal and a signal on the complement clock input terminal to be passed to the output clock terminal during power-up.

3. The DFS circuit of claim 1, wherein the control circuit comprises means for selecting a divide-by-two function for the DFS circuit.

4. The DFS circuit of claim 3, wherein the control circuit comprises:
   means for selecting a divide-by-two function providing an output signal with edges aligned to rising edges received at the true clock terminal; and
   means for selecting a divide-by-two function providing an output signal with edges aligned to falling edges received at the true clock terminal.

5. The DFS circuit of claim 1, wherein the control circuit comprises means for selecting a multiply-by-two function for the DFS circuit.

6. The DFS circuit of claim 1, wherein the control circuit comprises means for selecting a divide-by-N function for the DFS circuit, where N is an even number other than two.

7. The DFS circuit of claim 1, further comprising a clock delay circuit coupled between the true clock input terminal and the second input terminal of the control circuit.

8. The DFS circuit of claim 7, wherein the clock delay circuit comprises:
   a series of delay elements;
   a slow pullup circuit coupled at a first point along the series of delay elements, the slow pullup circuit having an enable control terminal; and
   a slow pulldown circuit coupled at a second point along the series of delay elements, the slow pulldown circuit having an enable control terminal.

9. The DFS circuit of claim 8, wherein the first point and the second point are the same.

10. The DFS circuit of claim 1, wherein the DFS circuit forms a portion of a programmable logic device (PLD).

11. A digital frequency synthesizer (DFS) circuit, comprising:
    a true clock input terminal providing an input clock signal having a first frequency;
    a complement clock input terminal providing an input signal comprising a complement of the input clock signal;
    an output clock terminal;
    a first passgate coupled between the true clock input terminal and the output clock terminal;
    a second passgate coupled between the complement clock input terminal and the output clock terminal;
    a keeper circuit having an output terminal coupled to the output clock terminal; and
    means for controlling the first and second passgates to provide an output clock signal having a second frequency to the output clock terminal, the second frequency being one of an integral multiple and divisor of the first frequency.

12. The DFS circuit of claim 11, wherein the means for controlling the first and second passgates comprises means for selecting between the output clock signal having a rising edge corresponding to a rising edge of the input clock signal and the output clock signal having a rising edge corresponding to a falling edge of the input clock signal.

13. The DFS circuit of claim 11, wherein the means for controlling the first and second passgates comprises means for selecting the second frequency, wherein the second frequency is half the first frequency.

14. The DFS circuit of claim 13, wherein the means for controlling the first and second passgates comprises means for selecting between the output clock signal having a rising edge corresponding to a rising edge of the input clock signal and the output clock signal having a rising edge corresponding to a falling edge of the input clock signal.

15. The DFS circuit of claim 11, wherein the means for controlling the first and second passgates comprises means for selecting the second frequency, wherein the second frequency is twice the first frequency.

16. The DFS circuit of claim 11, wherein the means for controlling the first and second passgates comprises means for selecting the second frequency, wherein the second frequency is N times the first frequency, where N is an even number greater than two.

17. The DFS circuit of claim 11, wherein the means for controlling the first and second passgates comprises means for supplying disable signals to enable terminals of the first and second passgates, the DFS circuit further comprising:

means for providing a ground signal to the output clock terminal when disable signals are provided to the enable terminals of the first and second passgates.

18. The DFS circuit of claim 11, wherein the DFS circuit forms a portion of a programmable logic device (PLD).

* * * * *